(12) United States Patent
Reohr et al.

(10) Patent No.: US 9,595,970 B1
(45) Date of Patent: Mar. 14, 2017

(54) SUPERCONDUCTING CELL ARRAY LOGIC CIRCUIT SYSTEM

(71) Applicants: William Robert Reohr, Severna Park, MD (US); Robert J Voigt, Arnold, MD (US)

(72) Inventors: William Robert Reohr, Severna Park, MD (US); Robert J Voigt, Arnold, MD (US)

(73) Assignee: Northrop Grumman Systems Corporation, Falls Church, VA (US)

( * ) Notice: Subject to any disclaimer, the term of this patent is extended or adjusted under 35 U.S.C. 154(b) by 0 days.

(21) Appl. No.: 15/079,106

(22) Filed: Mar. 24, 2016

(51) Int. Cl.
| | |
|---|---|
| *H03K 19/195* | (2006.01) |
| *H03K 19/00* | (2006.01) |
| *H03K 19/177* | (2006.01) |
| *G11C 11/44* | (2006.01) |
| *G06N 99/00* | (2010.01) |

(52) U.S. Cl.
CPC ......... *H03K 19/195* (2013.01); *G06N 99/002* (2013.01); *G11C 11/44* (2013.01); *H03K 19/0008* (2013.01); *H03K 19/1776* (2013.01)

(58) Field of Classification Search
CPC ............. H03K 19/195; H03K 19/0008; H03K 19/1776; G06N 99/002; G11C 11/44
USPC ........................................................ 326/4, 5
See application file for complete search history.

(56) References Cited

U.S. PATENT DOCUMENTS

| | | | | |
|---|---|---|---|---|
| 4,633,439 A | * | 12/1986 | Harada | .................... G11C 11/44 257/E27.007 |
| 6,154,044 A | * | 11/2000 | Herr | .................... H03K 19/1952 326/1 |
| 6,386,141 B1 | * | 5/2002 | Forsen | .................. A01J 5/0175 119/14.08 |
| 7,443,719 B2 | * | 10/2008 | Kirichenko | .............. G11C 8/10 365/160 |
| 9,281,057 B1 | * | 3/2016 | Herr | ......................... G11C 11/44 |
| 2016/0013791 A1 | * | 1/2016 | Herr | ......................... H03K 3/38 326/5 |

FOREIGN PATENT DOCUMENTS

JP        EP 0112962 A2 * 7/1984 ............. G11C 11/44

\* cited by examiner

*Primary Examiner* — Dylan White
(74) *Attorney, Agent, or Firm* — Tarolli, Sundheim, Covell & Tummino LLP

(57) ABSTRACT

One embodiment describes a superconducting cell array logic circuit system. The system includes a plurality of superconducting cells arranged in an array of at least one row and at least one column. The superconducting cell array logic circuit system can be configured to implement a logic operation on at least one logic input signal received at at least one respective input associated with the respective at least one row to provide at least one logic output signal on at least one respective output associated with the at least one column based on a predetermined selective coupling of the at least one input to the at least one output via the plurality of superconducting cells.

20 Claims, 9 Drawing Sheets

SUPERCONDUCTING CELL ARRAY LOGIC CIRCUIT SYSTEM

TECHNICAL FIELD

The present invention relates generally to quantum and classical digital superconducting circuits, and specifically to a superconducting cell array logic circuit system.

BACKGROUND

In the field of digital logic, extensive use is made of well known and highly developed CMOS (complimentary metal-oxide semiconductor) technology. CMOS has been implemented in a number of computer systems to provide digital logic capability. As CMOS has begun to approach maturity as a technology, there is an interest in alternatives that may lead to higher performance in terms of speed, power dissipation computational density, interconnect bandwidth, and the like. An alternative to CMOS technology comprises superconductor based single flux quantum circuitry, utilizing superconducting Josephson junctions. Superconducting digital technology has provided computing and/or communications resources that benefit from unprecedented high speed, low power dissipation, and low operating temperature. For example, superconducting digital systems can operate with a typical signal power of around 4 nW (nanowatts), at a typical data rate of 20 Gb/s (gigabits/second), or greater, and operating temperatures of around 4° Kelvin or less.

SUMMARY

One embodiment describes a superconducting cell array logic circuit system. The system includes a plurality of superconducting cells arranged in an array of at least one row and at least one column. The superconducting cell array logic circuit system can be configured to implement a logic operation on at least one logic input signal received at at least one respective input associated with the respective at least one row to provide at least one logic output signal on at least one respective output associated with the at least one column based on a predetermined selective coupling of the at least one input to the at least one output via the plurality of superconducting cells.

Another embodiment includes a method for generating a superconducting cell array logic circuit system. The method includes providing a plurality of superconducting cells arranged in an array of at least one row and at least one column. The method also includes providing at least one input associated with each of the respective at least one row. The method also includes providing at least one output that is coupled to each of the plurality of superconducting cells associated with each of the respective at least one column. The method further includes selectively coupling the at least one input to the plurality of superconducting cells in a predetermined manner to facilitate at least one logic output signal associated with the respective at least one output that is a logic operation output in response to at least one logic input signal provided via the respective at least one input based on the selective coupling.

Another embodiment includes a superconducting circuit system. The system includes a first superconducting cell array logic circuit system comprising a first plurality of superconducting cells arranged in a first array of at least one row and at least one column. The first superconducting cell array logic circuit system can be configured to implement a first logic operation on at least one logic input signal received at a respective at least one first input associated with the respective at least one row of the first array to provide at least one first logic output signal on a respective at least one first output associated with the at least one column of the first array based on a predetermined selective coupling of the at least one first input to the at least one first output via the plurality of superconducting cells. The system also includes a second superconducting cell array logic circuit system comprising a second plurality of superconducting cells arranged in a second array of at least one row and at least one column. The second superconducting cell array logic circuit system can be configured to implement a second logic operation on at least one second logic input signal received at a respective at least one second input associated with the respective at least one row of the second array and being coupled to the at least one first output to provide at least one second logic output signal on a respective at least one second output associated with the at least one column of the second array based on a predetermined selective coupling of the at least one second input to the at least one second output via the second plurality of superconducting cells.

DETAILED DESCRIPTION

Figure 1:
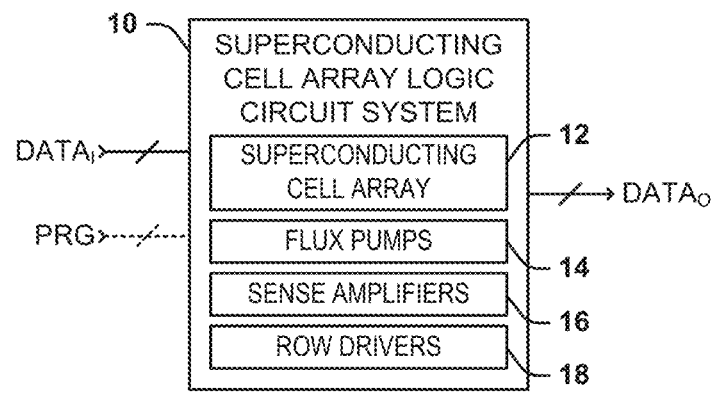
FIG. 1 illustrates an example of a superconducting cell array logic circuit system.

The present invention relates generally to quantum and classical digital superconducting circuits, and specifically to a superconducting cell array logic circuit system. A superconducting cell array logic circuit system can be implemented to perform logic operations in a superconducting environment, such as in a reciprocal quantum logic (RQL) quantum computing environment. Thus, the logic operations associated with the superconducting cell array logic circuit system can be performed with respect to single flux quantum (SFQ) pulses. A given superconducting cell array logic circuit system can include a plurality of superconducting cells that are arranged in an array of at least one row and at least one column. At least one input that is associated with the respective at least one row can receive respective logic input signal(s), and at least one output that is associated with the respective at least one column can correspond to a logical output based on a predetermined logic operation associated with the superconducting cell array logic circuit system. As described herein, the term "logic signal" (including "logic input signal" and "logic output signal") with respect to the superconducting cell array logic circuit system describes the presence of a signal (e.g., indicative of a logic-1 signal) or the absence of a signal (e.g., indicative of a logic-0 signal). Therefore, in the context of RQL, the term "signal" can describe the presence of at least one pulse to indicate a first logic state (e.g., logic-1) or the absence of an SFQ pulse to indicate a second logic state (e.g., logic-0). Additionally, in the context of RQL, the at least one pulse can correspond to a positive pulse (e.g., SFQ pulse or fluxon) followed by a negative pulse (e.g., negative SFQ pulse or anti-fluxon).

The predetermined logic operation can be based on a selective coupling of the at least one input to the at least one output via the superconducting cells. Stated another way, the predetermined logic operation can be based on a selective coupling of the at least one input to the superconducting cells, which are coupled to the at least one output in each respective column. As described herein, the term "selective coupling" with respect to a given one of the superconducting cells describes a condition of a respective input of a given one of the superconducting cells being either coupled or decoupled from a respective output of the given one of the superconducting cells, or either coupled or decoupled from a respective one of the superconducting cells. Therefore, for a given array of superconducting cells, the array of superconducting cells can have inputs that are selectively coupled to one or more outputs, such that all, some (e.g., a proper subset), or none of the input(s) to the respective superconducting cells can be coupled to the output(s) via the respective superconducting cells in a predetermined manner. Accordingly, input(s) that are coupled to the respective output(s) via the respective superconducting cell(s) based on the selective coupling are described herein as "coupled", and thus the respective coupled superconducting cell(s) provide a corresponding output logic signal in response to a logic input signal. Conversely, input(s) that are not coupled to the respective output(s) via the respective superconducting cell(s) based on the selective coupling are described herein as "uncoupled" or "non-coupled", and thus the respective uncoupled superconducting cell(s) do not provide a corresponding output logic signal in response to a logic input signal.

The selective coupling of the input(s) to the output(s) via the superconducting cells can be provided based on a manner of manufacture of the superconducting cell array logic circuit system, or can be field-programmable in a manner similar to a field-programmable gate array (FPGA). For example, the selective coupling can be based on the presence or absence of an inductive coupling of the input(s) to a superconducting quantum interference device (SQUID) associated with the respective superconducting cell, with the SQUID being coupled to a respective one of the output(s). Therefore, one or more Josephson junctions associated with the SQUID can trigger in response to a respective logic input signal to provide a respective output signal in a first logic state based on the inductive coupling, or will not trigger in response to the respective logic input signal(s) to provide the respective output signal in a second logic state based on no inductive coupling. As another example, each of the superconducting cells can include a hysteretic magnetic Josephson junction device (HMJJD) configured to store one of a first magnetic state and a second magnetic state in response to at least one programming signal. Thus, the HMJJD can provide the coupling between the respective input(s) and the output(s) in the first magnetic state, and can provide non-coupling between the respective input(s) and the output(s) in the second magnetic state. Accordingly, providing the programming signal(s) to set the magnetic state of the HMJJD can facilitate field-programmability of the superconducting cell array logic circuit system to set the logic operation.

FIG. 1 illustrates an example of a superconducting cell array logic circuit system 10. The superconducting cell array logic circuit system 10 can be implemented in any of a variety of quantum and/or classical computer systems. In the example of FIG. 1, the superconducting cell array logic circuit system 10 is configured to implement a logic operation on at least one logic input signal $DATA_I$ to provide at least one logic output signal $DATA_O$. For example, the superconducting cell array logic circuit system 10 can be implemented in an RQL quantum computing environment, such that the logic input signal(s) $DATA_I$ and the logic output signal(s) $DATA_O$ can correspond to the presence of SFQ pulses in a first logic state and the absence of SFQ pulses in a second logic state. As an example, the logic operation can correspond to any of a variety of Boolean logic functions (e.g., logical-AND, logical-OR, logical-NOR, logical-XOR, etc.).

The superconducting cell array logic circuit system 10 includes a superconducting cell array 12 that can correspond to a plurality of superconducting cells arranged in at least one row and at least one column. The logic input signal(s) $DATA_I$ can each be provided on a respective at least one input, and the logic output signal(s) $DATA_O$ can each be provided on a respective at least one output, such that each of the input(s) can be associated with a given row and each of the output(s) can be associated with a given column, respectively, of the superconducting cell array 12. For example, each of the superconducting cells in the superconducting cell array 12 can include a SQUID, and thus at least one Josephson junction, that is coupled to a respective output. Each of the input(s) can be selectively coupled with the respective superconducting cells of the superconducting cell array 12 in each of row(s), such as based on a coupling of the input(s) to the respective SQUID associated with the respective superconducting cell in each of the row(s). Therefore, in response to a coupling of a given input to a respective superconducting cell of the superconducting cell array 12, the superconducting cell can provide a respective logic output signal $DATA_O$ in response to a logic input signal $DATA_I$.

In the example of FIG. 1, it is to be appreciated that other circuits, demonstrated as flux pumps 14, sense amplifiers 16, and row drivers 18, can support interactions with the superconducting cell array 12. Signals into and out of the superconducting cell array 12 can involve a plurality of flux quanta. When activated by a pulse (e.g., an SFQ or RQL pulse), a row driver 18 can drive a multiple-flux-quanta pulse, referred to hereinafter as an "input pulse", through each of the superconducting cells in a row of the superconducting cell array 12. When the superconducting cell pulses due to an active row pulse, or, for example, due to the presence of a HMJJD in the π state, the superconducting cell produces a multiple-flux-quanta pulse that can be exhibited as a voltage, that travels through zero or more superconducting cells in a column of the superconducting cell array 12 to one of the sense amplifiers 16 where it is received. Upon detecting a multiple-flux-quanta pulse, the sense amplifier(s) 16 can generate a pulse corresponding to an output of the of the superconducting cell array logic circuit system 10 (e.g., exhibited as an SFQ pulse or an RQL pulse).

Figure 2:
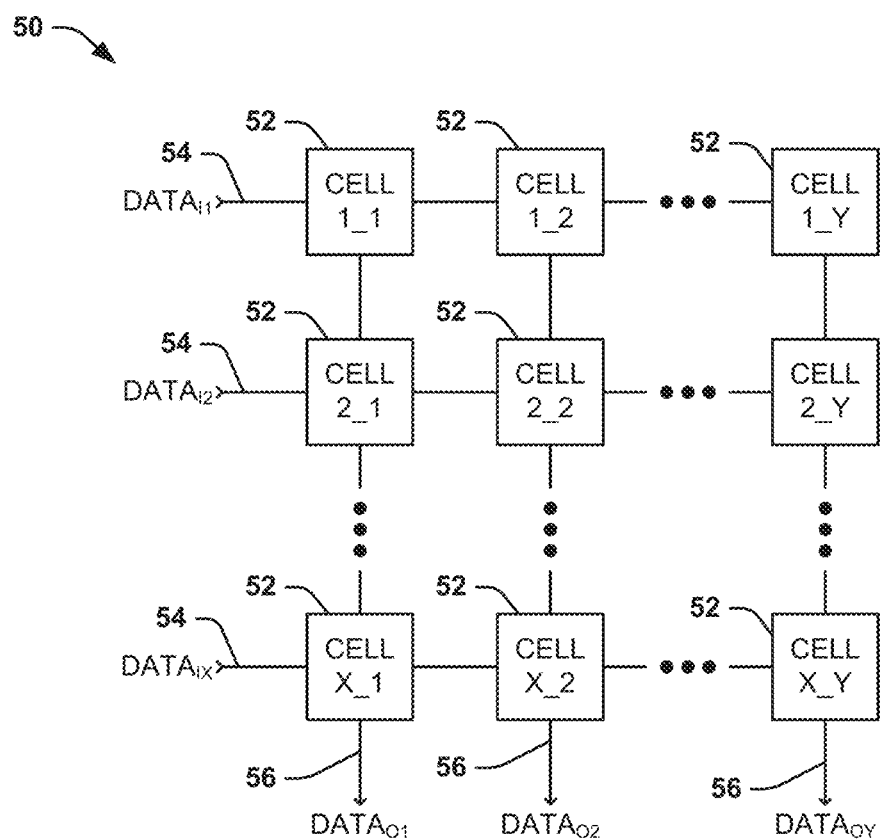
FIG. 2 illustrates an example of a superconducting cell array.

FIG. 2 illustrates an example of a superconducting cell array 50. The superconducting cell array 50 can correspond to the superconducting cell array 12 in the example of FIG. 1. Therefore, reference is to be made to the example of FIG. 1 in the following description of the example of FIG. 2. The superconducting cell array 50 includes a plurality of superconducting cells 52 that are arranged in an array of X rows and Y columns, where X and Y are each positive integers. Thus, the superconducting cells 52 are labeled in a "ROW_COLUMN" designation corresponding to a relative position in the superconducting cell array 50. In the example of FIG. 2, the superconducting cell array 50 is provided that has a plurality of logic input signals, demonstrated as signals $DATA_{I1}$ through $DATA_{IX}$, on separate respective inputs 54. Similarly, the superconducting cell array 50 is demonstrated as generating a plurality of logic output signals, demonstrated as signals $DATA_{O1}$ through $DATA_{OY}$, on separate respective outputs 56. Therefore, each of the inputs 54 is associated with each of the superconducting cells 52 in a respective row of the superconducting cell array 50, and each of the outputs 56 is associated with each of the superconducting cells 52 in a respective column of the superconducting cell array 50.

Referring back to the example of FIG. 1, as an example, a dedicated row driver of the row drivers 18 drives each input signal (e.g., $DATA_{I1}$ in the example of FIG. 2) with an input pulse (e.g., a multiple flux quanta signal). A dedicated sense amplifier of the sense amplifiers 16 receives each output signal (e.g., $DATA_{O1}$ in the example of FIG. 2) and produces a pulse in response to a voltage pulse produced by an active superconducting cell of the superconducting cell array 12. As another example, the selective coupling of the input(s) to the output(s) via the respective superconducting cells of the superconducting cell array 12 can be provided based on a manner of manufacture of the superconducting cell array logic circuit system 10. As an example, the selective coupling can be based on the presence or absence of an inductive coupling of a given one of the input(s) to the respective SQUID associated with a given one of the superconducting cells of the superconducting cell array 12. The SQUID can be coupled to a respective one of the output(s), such that the Josephson junction(s) associated with the SQUID can trigger in response to a respective one of the logic input signal(s) $DATA_I$ to provide a respective one of the logic output signal(s) $DATA_O$ in a first logic state (e.g., logic-1) based on the inductive coupling. Conversely, the Josephson junction(s) associated with the SQUID will not trigger in response to the respective one of the logic input signal(s) $DATA_I$ to provide the respective logic output signal $DATA_O$ in a second logic state (e.g., logic-0) based on a lack of inductive coupling of the given one of the input(s) to the respective SQUID associated with a given one of the superconducting cells of the superconducting cell array 12.

As another example, the selective coupling of the input(s) to the output(s) via the respective superconducting cells of the superconducting cell array 12 can be field-programmable in a manner similar to an FPGA. For example, each of the superconducting cells can include an HMJJD configured to store one of a first magnetic state and a second magnetic state in response to at least one programming signal, demonstrated in the example of FIG. 1 as signal(s) PRG provided at a dotted-line input. Thus, the HMJJD can provide the coupling between the respective input(s) and the output(s) in the first magnetic state, such that the Josephson junction(s) associated with the SQUID can trigger in response to a respective one of the logic input signal(s) $DATA_I$ to provide a respective one of the logic output signal(s) $DATA_O$ in a first logic state (e.g., logic-1) based on the first magnetic state (e.g., based on a directional superconducting phase of the HMJJD in a π-state). Conversely, the HMJJD can provide non-coupling between the respective input(s) and the output(s) in the second magnetic state, such that the Josephson junction(s) associated with the SQUID will not trigger in response to a respective one of the logic input signal(s) $DATA_I$ to provide a respective one of the logic output signal(s) $DATA_O$ in a second logic state (e.g., logic-0) based on the second magnetic state (e.g., based on no superconducting phase of the HMJJD in a zero-state). Accordingly, the programming signal(s) PRG can selectively set the magnetic state of the HMJJD associated with each of the superconducting cells in the superconducting cell array 12 to provide selective coupling of the input(s) to the superconducting cells of the superconducting cell array 12, and thus to set the logic operation of the superconducting cell array logic circuit system 10.

In the example of FIG. 1, the superconducting cell array logic circuit system 10 also includes flux pumps 14 and sense amplifiers 16. The flux pumps 14 can be configured to generate a bias current that passes through a column of cells, such that the coupled superconducting cells of the superconducting cell array 12 can provide the logic output signal(s) $DATA_O$ in response to the logic input signal(s) $DATA_I$. The Josephson junction(s) in the respective superconducting cells trigger when the current passing through them exceeds a current threshold. The sense amplifiers 16 can thus detect an increase in voltage associated with the output(s) corresponding to the logic output signal(s) $DATA_O$, and can thus generate an SFQ pulse that can be output to other circuit components to which the output(s) can be coupled. In addition, as another example, the flux pumps 14 can also be associated with the programming signal(s) PRG, such that the flux pumps 14 can generate write current(s) that are selectively provided to the HMJJDs of the respective superconducting cells in the superconducting cell array 12 to selectively set the magnetic state of the respective HMJJDs (e.g., based on application or non-application of magnetic fields). Accordingly, the flux pumps 14 can be implemented for providing the selective coupling of the input(s) to the superconducting cells of the superconducting cell array 12, as well as for providing a bias current through the cells in each column.

Figure 3:
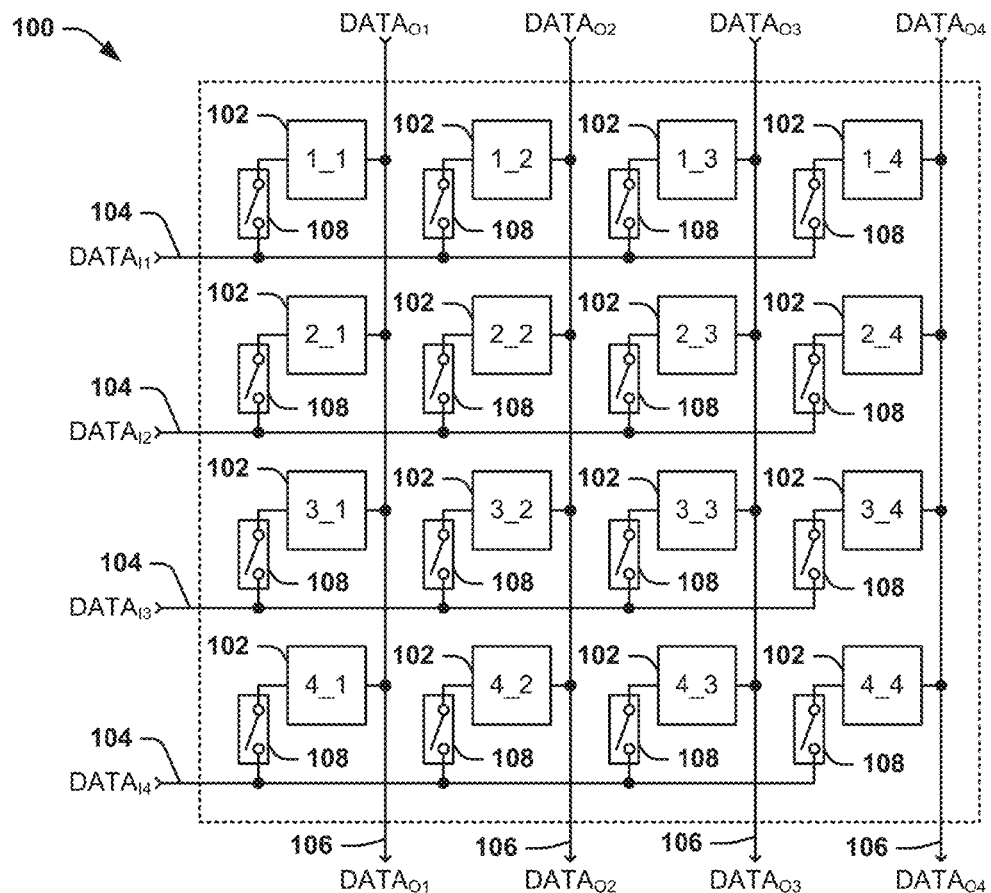
FIG. 3 illustrates another example of a superconducting cell array.

FIG. 3 provides a simplified logical view of a superconducting cell array 100. The superconducting cell array 100 can correspond to the superconducting cell array 12 in the example of FIG. 1. Therefore, reference is to be made to the example of FIG. 1 in the following description of the example of FIG. 3. The superconducting cell array 100 includes sixteen superconducting cells 102 that are arranged in an array of four rows and four columns, with the superconducting cells 102 being labeled in a "ROW_COLUMN" designation corresponding to a relative position in the superconducting cell array 100. In the example of FIG. 3, the superconducting cell array 100 is provided four logic input signals, demonstrated as signals $DATA_{I1}$ through $DATA_{I4}$, on separate respective inputs 104. Similarly, the superconducting cell array 100 is demonstrated as generating four logic output signals, demonstrated as signals $DATA_{O1}$ through $DATA_{O4}$, on separate respective outputs 106. Therefore, each of the inputs 104 is associated with each of the superconducting cells 102 in a respective row of the superconducting cell array 100, and each of the outputs 106 is associated with each of the superconducting cells 102 in a respective column of the superconducting cell array 100.

In the example of FIG. 3, each of the inputs 104 is demonstrated as being selectively coupled to a set of four of the superconducting cells 102 corresponding to a respective one of the four rows via a switch 108. The demonstration of the switches 108 in the example of FIG. 3 is intended to demonstrate selective coupling of the inputs 104 to the respective superconducting cells 102. Thus, while the coupling of the inputs 104 to the superconducting cells 102 can be via switches, the superconducting array 100 is not intended to be limited to the use of the switches 108 to denote the selective coupling, such that the switches 108 may not correspond to actual switches.

As a first example, the selective coupling of the inputs 104 to the outputs 106 via the superconducting cells 102 can be provided based on a manner of manufacture of the superconducting cell array logic circuit system in which the superconducting array 100 is implemented. For example, the selective coupling of the inputs 104 to the outputs 106 can be based on the presence or absence of an inductive coupling of the inputs 104 to a SQUID associated with the respective superconducting cell 102, with the SQUID being coupled to a respective one of the outputs 106. Therefore, one or more Josephson junctions associated with the SQUID can trigger in response to a respective one of the logic input signals $DATA_{I1}$ through $DATA_{I4}$ to provide one or more of the respective output signals $DATA_{O1}$ through $DATA_{O4}$ based on the inductive coupling, or will not trigger in response to the respective logic input signal(s) to not provide the respective output signal based on no inductive coupling.

Figure 4:
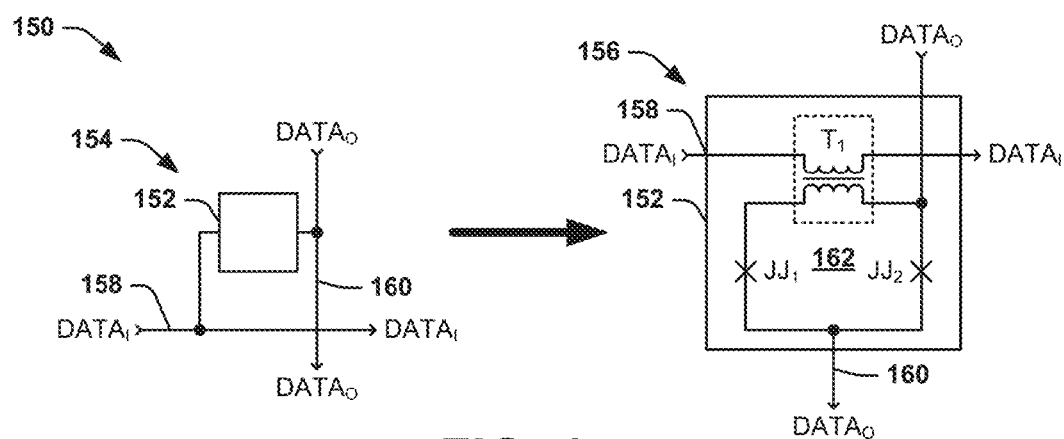
FIG. 4 illustrates an example diagram of a superconducting cell.

FIG. 4 illustrates an example diagram 150 of a superconducting cell 152. The superconducting cell 152 can correspond to one of the superconducting cells 52 or 102 in the respective examples of FIGS. 2 and 3, and thus can be implemented in the superconducting cell array 12 in the example of FIG. 1. Therefore, reference is to be made to the examples of FIGS. 1-3 in the following description of the examples of FIG. 4.

The superconducting cell 152 is demonstrated in the example of FIG. 4 in a first logical view 154 and a second schematic view 156. The first logical view 154 corresponds to a block-diagram that demonstrates the superconducting cell 152 as being coupled to a respective input 158 on which a logic input signal $DATA_I$ is provided. In the example of FIG. 4, the first logical view 154 demonstrates a closed-circuit between the input 158 and the superconducting cell 152, with the closed-circuit being indicative of an equivalent coupling between the input 158 and the superconducting cell 152 that results in the generation of a logic output signal $DATA_O$ on a respective output 160 to which the superconducting cell 152 is coupled in response to the logic input signal $DATA_I$. Thus, the first logical view 154 is equivalent to one of the switches 108 being closed in the superconducting cell array 100 in the example of FIG. 3.

The second schematic view 156 demonstrates an equivalent circuit of the superconducting cell array 152. The superconducting cell 152 includes a SQUID 162 that is formed by a loop that includes a first Josephson junction $JJ_1$ and a second Josephson junction $JJ_2$, and to which the output 160 is coupled, such that the logic output signal $DATA_O$ passes through the SQUID 162. In the example of FIG. 4, the input 158 passes through the superconducting cell 152, and is inductively coupled to the SQUID 162 via a transformer $T_1$. Therefore, the inductive coupling of the input 158 to the SQUID 162 via the transformer $T_1$ provides coupling of the input 158 to the output 160. In the example of FIG. 4, the logic input signal $DATA_I$ can be provided on the input 158, and a bias current (e.g., generated via the flux pumps 14) can be provided on the output 160. The bias current can thus lower the triggering threshold of at least one of the first and second Josephson junctions $JJ_1$ and $JJ_2$.

In response to the logic input signal $DATA_I$, a current can be induced in the SQUID 162 via the transformer $T_1$, as provided on the secondary winding of the transformer $T_1$ based on the logic input signal $DATA_I$ being provided through the primary winding of the transformer $T_1$. Accordingly, the current that is induced in the SQUID 162 can be sufficient to trigger the Josephson junctions $JJ_1$ and $JJ_2$ (e.g., sequentially) to set the output 160 to a voltage state, and thus increasing the voltage on the output 160. As an example, the increase in voltage on the output 160 can be detected by a sense amplifier (e.g., the sense amplifiers 16 in the example of FIG. 1). As an example, the associated sense amplifier can be configured to generate an SFQ pulse in response to detecting the voltage state on the output 160. Accordingly, in the example of FIG. 4, the superconducting cell 152 can generate the logic output signal $DATA_O$ as a pulse in response to a logic input signal $DATA_I$, thus providing the logic output signal $DATA_O$ in a first logic state (e.g., a logic-1).

Figure 5:
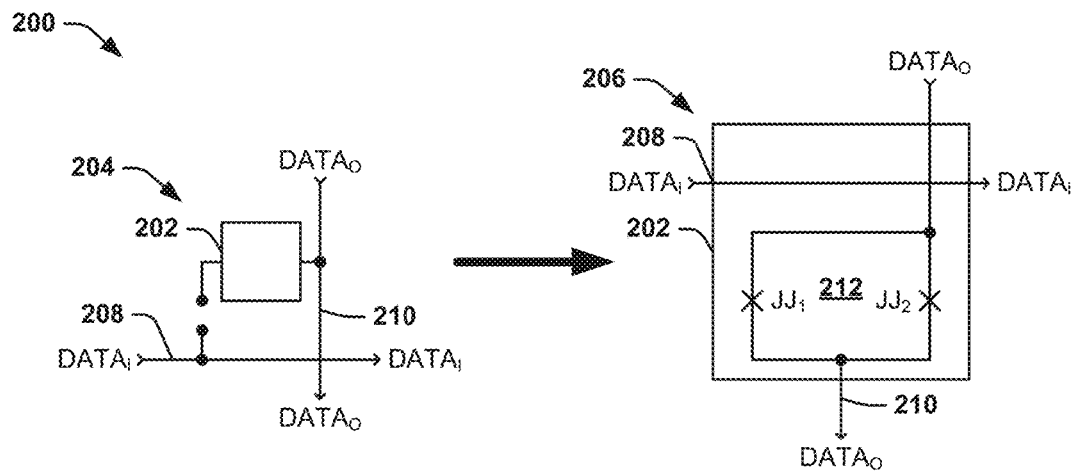
FIG. 5 illustrates another example diagram of a superconducting cell.

FIG. 5 illustrates an example diagram 200 of a superconducting cell 202. The superconducting cell 202 can correspond to one of the superconducting cells 52 or 102 in the respective examples of FIGS. 2 and 3, and thus can be implemented in the superconducting cell array 12 in the example of FIG. 1. Therefore, reference is to be made to the examples of FIGS. 1-3 in the following description of the examples of FIG. 5.

The superconducting cell 202 is demonstrated in the example of FIG. 5 in a first logical view 204 and a second schematic view 206. The first logical view 204 corresponds to a block-diagram that demonstrates the superconducting cell 202 as being uncoupled to a respective input 208 on which a logic input signal $DATA_I$ is provided. In the example of FIG. 5, the first logical view 204 demonstrates an open-circuit between the input 208 and the superconducting cell 202, with the open-circuit being indicative of a non-coupling between the input 208 and the superconducting cell 202 that results in no generation of a logic output signal $DATA_O$ on a respective output 210 to which the superconducting cell 202 is coupled in response to the logic input signal $DATA_I$. Thus, the first logical view 204 is equivalent to one of the switches 108 being open in the logical view of the superconducting cell array 100 in the example of FIG. 3.

The second schematic view 206 demonstrates an equivalent circuit of the superconducting cell 202. The superconducting cell 202 includes a SQUID 212 that is formed by a loop that includes a first Josephson junction $JJ_3$ and a second Josephson junction $JJ_4$, and to which the output 210 is coupled, such that the logic output signal $DATA_O$ passes through the SQUID 212. In the example of FIG. 5, the input 208 passes through the superconducting cell 202. However, unlike the superconducting cell 152 in the example of FIG. 4, there is no inductive coupling between the input 208 and the SQUID 212 in the superconducting cell 202 based on the absence of a transformer. Therefore, the lack of an inductive coupling of the input 208 to the SQUID 212 provides for a lack of coupling of the input 208 to the output 210. Similar to as described in the example of FIG. 4, the logic input signal $DATA_I$ can be provided on the input 208, and a bias current (e.g., generated via the flux pumps 14) can be provided on the superconducting cells in each column. However, based on the lack of coupling of the input 208 to the output 210, the Josephson junctions $JJ_3$ and $JJ_4$ do not trigger in response to the logic input signal $DATA_I$. In other words, based on the lack of coupling of the input 208 to the output 210, the threshold current of the Josephson junctions $JJ_3$ and $JJ_4$ is not achieved in response to the logic input signal $DATA_I$. Therefore, the output 210 does not enter the voltage state, and no SFQ pulse is generated on the output 210 (e.g., via the sense amplifiers 16). Accordingly, the logic output signal $DATA_O$ is provided in a second logic state (e.g., a logic-0).

Figure 6:
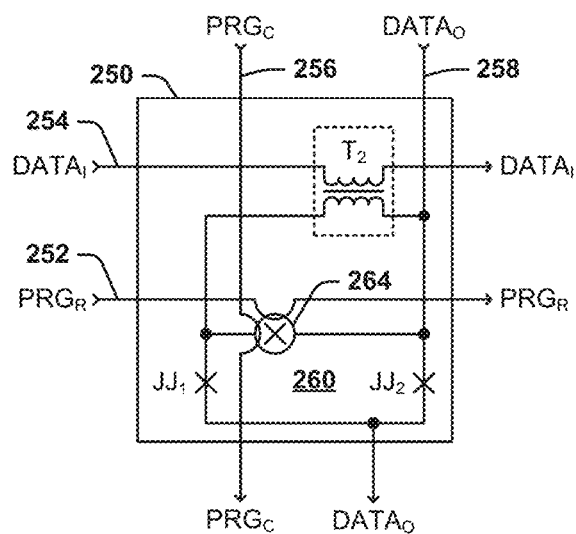
FIG. 6 illustrates an example of a superconducting cell.

FIG. 6 illustrates an example of a superconducting cell 250. The superconducting cell 252 can correspond to one of the superconducting cells 52 or 102 in the respective examples of FIGS. 2 and 3, and thus can be implemented in the superconducting cell array 12 in the example of FIG. 1. Therefore, reference is to be made to the examples of FIGS. 1-3 in the following description of the examples of FIG. 6. As described in greater detail herein, the operation of the superconducting cell 250 is substantially analogous to a memory cell with respect to the selective coupling, such that the superconducting cell array (e.g., the superconducting cell array 12) can be programmed to provide the selective coupling in a manner similar to writing data to a memory array, to configure each superconducting cell to provide the desired logic function of the superconducting cell array logic circuit system 10.

The superconducting cell 250 includes a row programming input 252 and an input 254 that each pass through the superconducting cell 250. The row programming input 252 conducts a row programming current $PRG_R$ during a programming operation, and the input 254 receives a logic input signal $DATA_I$, similar to as described previously. As an example, the row programming current $PRG_R$ can be associated with all of the superconducting cells in a given row of the superconducting cell array (e.g., the superconducting cell array 12), similar to the logic input signal $DATA_I$. Similarly, the superconducting cell 250 includes a column programming input 256 and an output 258 that each pass through the superconducting cell 250. The column programming input 256 conducts a column programming current $PRG_C$ during the programming operation, and the output 258 provides a logic output signal $DATA_O$, similar to as described previously. As an example, the column programming current $PRG_C$ can be associated with all of the superconducting cells in a given column of the superconducting cell array (e.g., the superconducting cell array 12), similar to the logic output signal $DATA_O$.

The superconducting cell 250 includes a SQUID 260 that is formed by a loop that includes a first Josephson junction $JJ_5$ and a second Josephson junction $JJ_6$, and to which the output 258 is coupled, such that the logic output signal $DATA_O$ passes through the SQUID 260. In the example of FIG. 6, the input 254 passes through the superconducting cell 250, and is inductively coupled to the SQUID 260 via a transformer $T_2$. The superconducting cell 250 further includes an HMJJD 264 (e.g., a phase hysteretic magnetic Josephson junction) that can have either a first magnetic state or a second magnetic state corresponding, respectively, to a first logic state or a second logic state. As an example, the HMJJD 264 can include ferromagnetic materials in associated barriers to be configured as a switchable π-junction. The HMJJD 264 can include outer layers of superconducting material, such as Niobium (Nb), and one or more internal thin film layers of ferromagnetic materials. As an example, the thin film layers of ferromagnetic materials can include one or more "hard" ferromagnetic layers having a substantially fixed magnetic field and one or more "soft" ferromagnetic layers that can be changed as a result of magnetic fields generated locally by orthogonal electrical currents (e.g., the programming currents $PRG_R$ and $PRG_C$). Furthermore, the HMJJD 264 can include one or more additional layers, such as oxide layers, that are interleaved with the superconducting and/or ferromagnetic layers.

In the example of FIG. 6, the row programming input 252 and the column programming input 256 are demonstrated as magnetically coupled to the HMJJD 264. As an example, the HMJJD 264 can include two or more different ferromagnetic layers, and the orientation of the magnetic field in one of the ferromagnetic layers is substantially fixed. The magnetic field orientation of the other one or more ferromagnetic layers can be changed as a result of magnetic fields that are generated locally by the row programming current $PRG_R$ and the column programming current $PRG_C$.

Therefore, based on the configuration of the HMJJD 264, the row programming current $PRG_R$ and the column programming current $PRG_C$ can generate the magnetic field to set the magnetic state of the HMJJD 264. The row programming current $PRG_R$ and the column programming current $PRG_C$ can function together first to destabilize the free magnetic layer and next to set the magnetic state of the HMJJD 264 to correspond to the first magnetic state or the second magnetic state, respectively.

The selective coupling of the input 254 to the SQUID 260, and thus to the output 258, can be based on the magnetic state of the HMJJD 264. For example, the logic input signal $DATA_I$ can be provided on the input 254, and a bias current (e.g., generated via the flux pumps 14) can be provided on the output 258. The bias current can thus lower the triggering threshold of at least one of the first and second Josephson junctions $JJ_5$ and $JJ_6$. The logic input signal $DATA_I$ can thus be inductively provided to the HMJJD 264 and the Josephson junctions $JJ_5$ and $JJ_6$. Therefore, the current induced by the logic input signal $DATA_I$ via the transformer $T_2$ is added to the bias current provided on the output 258. The magnetic state of the HMJJD 264 can be determinative of the critical current necessary to trigger the Josephson junctions $JJ_5$ and $JJ_6$ based on the superconducting phase that can be provided by the HMJJD 264. As described herein, the term "superconducting phase" corresponds to a spontaneous supercurrent circulating in a loop through the HMJJD 264 and the Josephson junctions 254 and 256 in response to the HMJJD 264 being in the π-state. As an example, the HMJJD 264 can have a first magnetic state corresponding to a zero state that is associated with non-coupling of the input 254 to the output 258, or can have a second magnetic state corresponding to a π-state that is associated with coupling of the input 254 to the output 258.

Figure 7:
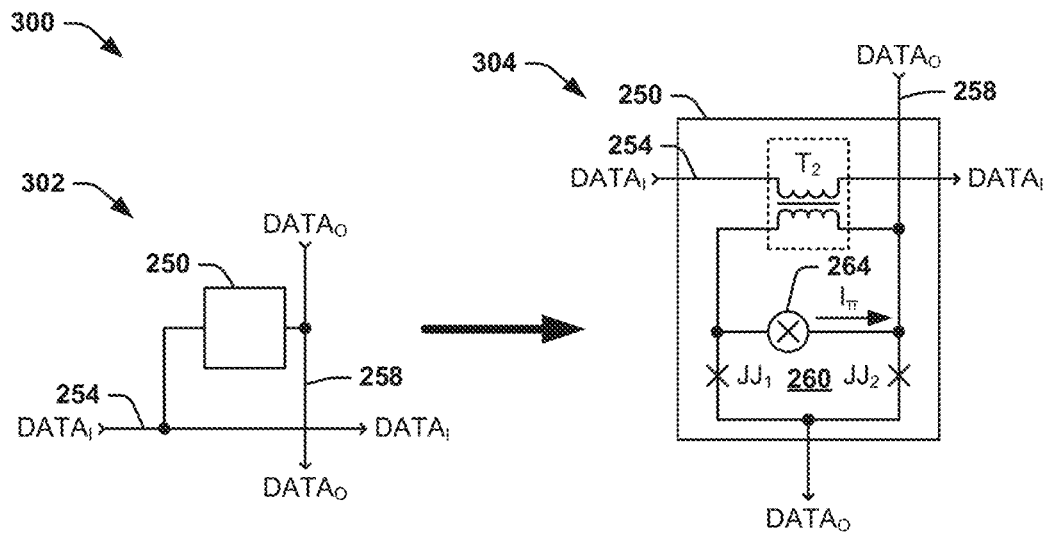
FIG. 7 illustrates yet another example diagram of a superconducting cell.

FIG. 7 illustrates yet a further example diagram 300 of the superconducting cell 250. The superconducting cell 250 is demonstrated in the example of FIG. 7 in a first logical view 302 and a second schematic view 304. The first logical view 302 corresponds to a block-diagram that demonstrates the superconducting cell 250 as being coupled to the input 254 on which a logic input signal $DATA_I$ is provided. In the example of FIG. 7, the first logical view 302 demonstrates a closed-circuit between the input 254 and the superconducting cell 250, with the closed-circuit being indicative of an equivalent coupling between the input 254 and the superconducting cell 250 that results in the generation of a logic output signal $DATA_O$ on the output 258 to which the superconducting cell 250 is coupled in response to the logic input signal $DATA_I$. Thus, the first logical view 302 is equivalent to one of the switches 108 being closed in the superconducting cell array 100 in the example of FIG. 3.

In the second schematic view 304 of the equivalent circuit, the coupling of the input 254 to the superconducting cell 250 can be achieved based on programming the superconducting cell 250 via the programming signals $PRG_R$ and $PRG_C$ (not shown in the example of FIG. 7) to switch the HMJJD 264 to a first magnetic state corresponding to the π-state. Thus, in the example of FIG. 7, the HMJJD 264 provides a phase current $I_\Pi$ corresponding to the superconducting phase of the HMJJD 264 in the diagram 300. Therefore, in the π-state, the HMJJD 264 provides coupling of the input 254 to the output 258 based on the HMJJD 264 having substantially maximum Josephson energy and providing the superconducting phase that is added (as the equivalent phase current $I_\Pi$) to the magnitude of the induced logic input signal $DATA_I$ and the bias current on the output 258. Therefore, the contribution of the superconducting phase, the induced logic input signal $DATA_I$, and the bias current is sufficient to trigger the Josephson junctions $JJ_5$ and $JJ_6$ to set the output 258 to a voltage state, and thus increasing the voltage on the output 258. As an example, the increase in voltage on the output 258 can be detected by a sense amplifier (e.g., the sense amplifiers 16 in the example of FIG. 1). For example, the associated sense amplifier can be configured to generate an SFQ pulse in response to detecting the voltage state on the output 258. Accordingly, when the HMJJD 264 is in the π-state, the superconducting cell 250 can generate the logic output signal $DATA_O$ as a pulse in response to a logic input signal $DATA_I$, thus providing the logic output signal $DATA_O$ in a first logic state (e.g., a logic-1).

Figure 8:
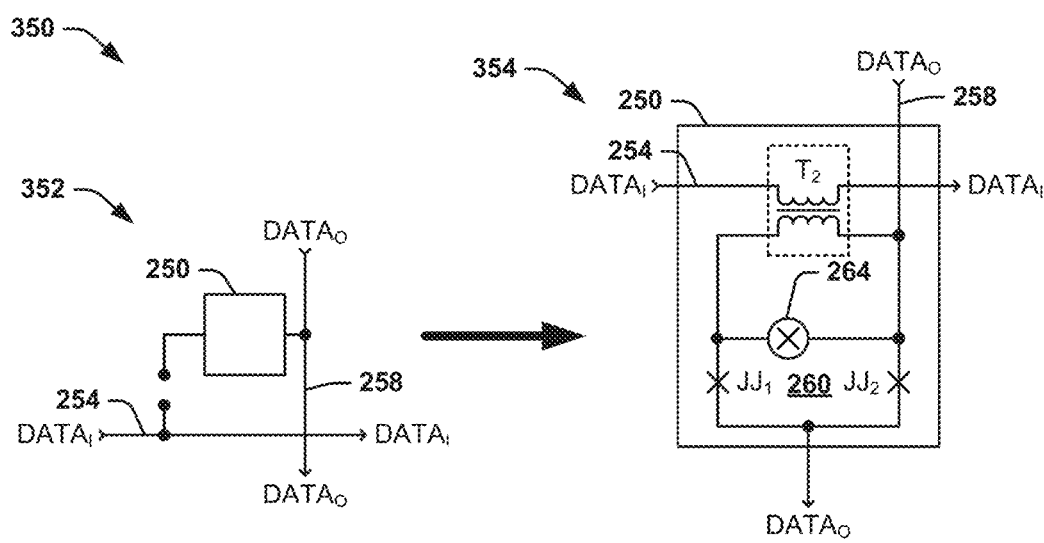
FIG. 8 illustrates yet a further example diagram of a superconducting cell.

FIG. 8 illustrates an example diagram 350 of the superconducting cell 250. The superconducting cell 250 is demonstrated in the example of FIG. 8 in a first logical view 352 and a second schematic view 354. The first logical view 352 corresponds to a block-diagram that demonstrates the superconducting cell 250 as being coupled to the input 254 on which a logic input signal $DATA_I$ is provided. In the example of FIG. 8, the first logical view 352 demonstrates an open-circuit between the input 254 and the superconducting cell 250, with the open-circuit being indicative of a lack of coupling between the input 254 and the superconducting cell 250. Thus, the first logical view 352 is equivalent to one of the switches 108 being open in the superconducting cell array 100 in the example of FIG. 3.

In the second schematic view 354, the non-coupling of the input 254 to the superconducting cell 250 can be achieved based on programming the superconducting cell 250 via the programming signals $PRG_R$ and $PRG_C$ (not shown in the example of FIG. 8) to switch the HMJJD 264 to a second magnetic state corresponding the zero state. Therefore, in the example of FIG. 8, the HMJJD 264 is in a substantially minimum Josephson energy ground state that does not provide superconducting phase, and thus, no equivalent phase current $I_\Pi$. Therefore, the added magnitude of the induced logic input signal $DATA_I$ and the bias current on the output 258 is insufficient to trigger the Josephson junctions $JJ_5$ and $JJ_6$. In other words, based on the lack of superconducting phase provided by the HMJJD 264 in the zero state, the threshold current of the Josephson junctions $JJ_5$ and $JJ_6$ is not achieved in response to the induced logic input signal $DATA_I$. Therefore, the output 258 does not enter the voltage state, and no pulse is generated on the output 258 (e.g., thus none is generated via the sense amplifiers 16). Accordingly, the logic output signal $DATA_O$ is provided in a second logic state (e.g., a logic-0).

Accordingly, FIGS. 4-8 provide examples of coupling and non-coupling of a given one input to a respective output via a respective superconducting cell. In the examples of FIG. 4, coupling can be achieved based on the presence of the transformer $T_1$ to provide inductive coupling between the input 158 and the SQUID 162 in the fabrication of the superconducting cell 152. In the example of FIG. 5, non-coupling can be achieved based on the absence of a transformer to provide no inductive coupling between the input 208 and the SQUID 212 in the fabrication of the superconducting cell 252. Therefore, the examples of FIGS. 4 and 5 provide that selective coupling in the superconducting cell array 12 can be achieved in a simple and efficient manner based on providing selective inclusion of transformers in the array of otherwise substantially identical superconducting cells during manufacture of the superconducting cell array logic circuit system 10. Alternatively, each of the superconducting cells in the superconducting cell array 12 can be configured substantially identical to the superconducting cell 250 in the examples of FIGS. 6-8. As a result, the selective coupling can be provided subsequent to manufacture of the superconducting cell array logic circuit system 10 based on the programming signals PRG, such as similar to an FPGA, to provide connection, as provided in the example of FIG. 7, or non-connection, as provided in the example of FIG. 8. Accordingly, the logic operation of the superconducting cell array logic circuit system 10 can be provided in a variety of ways.

Figure 9:
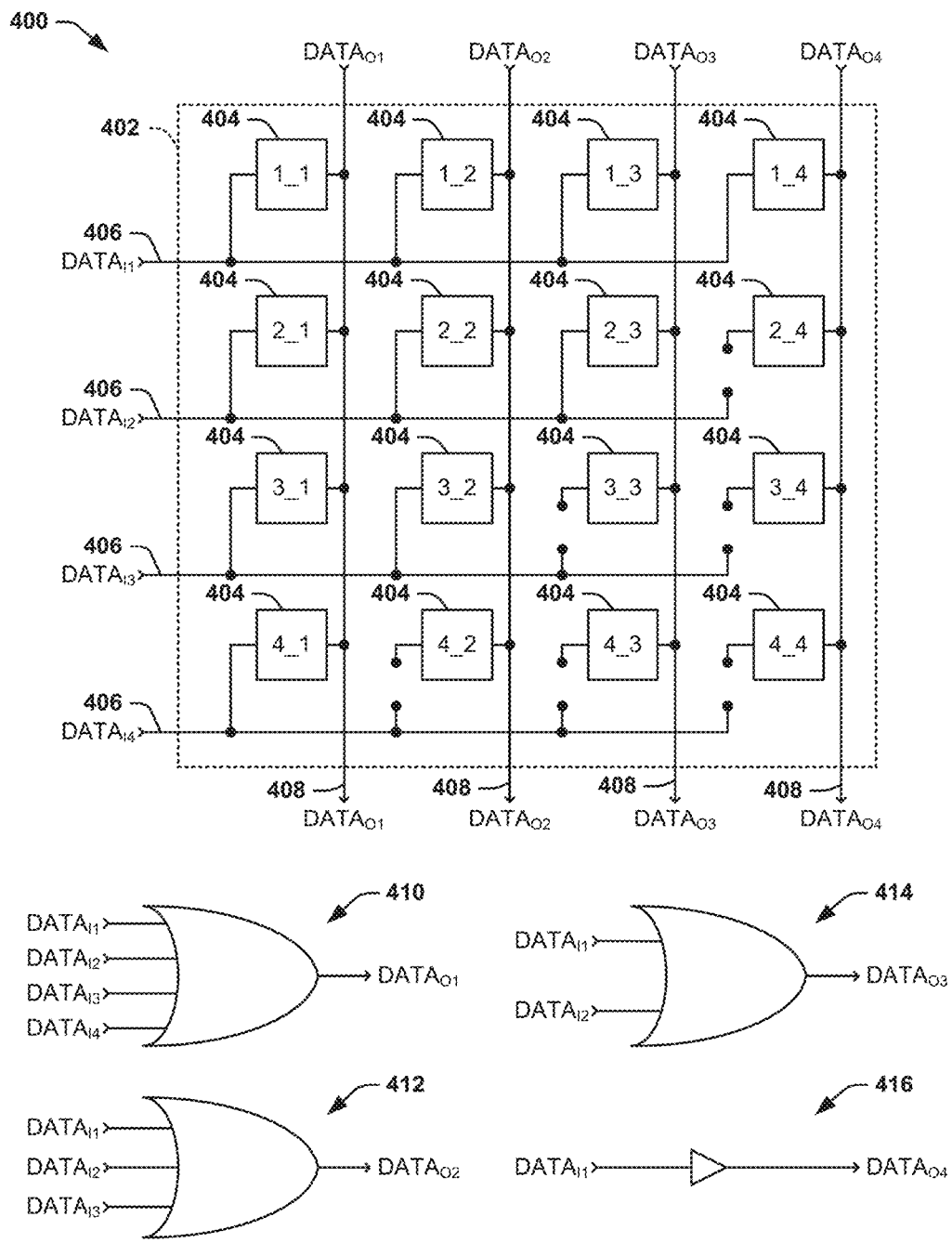
FIG. 9 illustrates an example diagram of a superconducting cell array logic circuit system.

FIG. 9 illustrates an example diagram 400 of a superconducting cell array logic circuit system 402. The superconducting cell array logic circuit system 402 can correspond to the superconducting cell array 12 in the example of FIG. 1. Therefore, reference is to be made to the example of FIG. 1 in the following description of the example of FIG. 9.

The superconducting cell array logic circuit system 402 includes sixteen superconducting cells 404 that are arranged in an array of four rows and four columns, with the superconducting cells 404 being labeled in a "ROW_COLUMN" designation corresponding to a relative position in the superconducting cell array logic circuit system 402. In the example of FIG. 9, the superconducting cell array logic circuit system 402 is provided four logic input signals, demonstrated as signals $DATA_{I1}$ through $DATA_{I4}$, on separate respective inputs 406. Similarly, the superconducting cell array logic circuit system 402 is demonstrated as generating four logic output signals, demonstrated as signals $DATA_{O1}$ through $DATA_{O4}$, on separate respective outputs 408. Therefore, each of the inputs 406 is associated with each of the superconducting cells 404 in a respective row of the superconducting cell array logic circuit system 402, and each of the outputs 408 is associated with each of the superconducting cells 404 in a respective column of the superconducting cell array logic circuit system 402.

In the example of FIG. 9, each of the inputs 406 is demonstrated as being selectively coupled to a set of four of the superconducting cells 404 corresponding to a respective one of the four rows. As an example, the selective coupling can be based on selective inductive coupling at manufacture of the superconducting cell array logic circuit system 402, such as demonstrated in the examples of FIGS. 4 and 5. As another example, the selective coupling can be based on programming signals (not shown in the example of FIG. 9) that are provided to set the magnetic state of an HMJJD associated with each of the superconducting cells 404, such as demonstrated in the examples of FIGS. 6-8. As yet another example, the selective coupling can be based on a combination of inductive coupling and the magnetic state of an HMJJD associated with one or more of the superconducting cells 404.

In the example of FIG. 9, the superconducting cells 404 in a first column corresponding to a first of the outputs 408 associated with the logic output signal $DATA_{O1}$ are all coupled to the respective inputs 406 corresponding to the logic input signals $DATA_{I1}$, $DATA_{I2}$, $DATA_{I3}$, and $DATA_{I4}$. Therefore, in response to an input pulse, such as indicative of a logic-high binary state, provided via any of the logic input signals $DATA_{I1}$, $DATA_{I2}$, $DATA_{I3}$, and $DATA_{I4}$, the logic output signal $DATA_{O1}$ is provided in a logic-high binary state (e.g., as an increased voltage on the respective output 408 resulting in an SFQ pulse via the sense amplifiers 16). Accordingly, the coupling of the respective inputs 406 corresponding to the logic input signals $DATA_{I1}$, $DATA_{I2}$, $DATA_{I3}$, and $DATA_{I4}$ to the output 408 associated with the first logic output signal $DATA_{O1}$ is equivalent to a logic-OR operation of the logic input signals $DATA_{I1}$, $DATA_{I2}$, $DATA_{I3}$, and $DATA_{I4}$, demonstrated at 410.

Similarly, a subset of the superconducting cells 404, demonstrated as superconducting cell 1_2, superconducting cell 2_2, and superconducting cell 3_2, in a second column corresponding to a second of the outputs 408 associated with the logic output signal $DATA_{O2}$ are coupled to the respective inputs 406 corresponding to the logic input signals $DATA_{I1}$, $DATA_{I2}$, and $DATA_{I3}$. Therefore, in response to a input pulse, such as indicative of a logic-high binary state, provided via any of the logic input signals $DATA_{I1}$, $DATA_{I2}$, and $DATA_{I3}$, the logic output signal $DATA_{O2}$ is provided in a logic-high binary state (e.g., as an increased voltage on the respective output 408 resulting in an SFQ pulse via the sense amplifiers 16). Accordingly, the coupling of the respective inputs 406 corresponding to the logic input signals $DATA_{I1}$, $DATA_{I2}$, and $DATA_{I3}$ to the output 408 associated with the second logic output signal $DATA_{O2}$ is equivalent to a logic-OR operation of the logic input signals $DATA_{I1}$, $DATA_{I2}$, and $DATA_{I3}$, demonstrated at 412.

Similarly, a pair of the superconducting cells 404, demonstrated as superconducting cell 1_3 and superconducting cell 2_3, in a third column corresponding to a third of the outputs 408 associated with the logic output signal $DATA_{O3}$ are coupled to the respective inputs 406 corresponding to the logic input signals $DATA_{I1}$ and $DATA_{I2}$. Therefore, in response to a input pulse, such as indicative of a logic-high binary state, provided via either of the logic input signals $DATA_{I1}$ or $DATA_{I2}$, the logic output signal $DATA_{O3}$ is provided in a logic-high binary state (e.g., as an increased voltage on the respective output 408 resulting in an SFQ pulse via the sense amplifiers 16). Accordingly, the coupling of the respective inputs 406 corresponding to the logic input signals $DATA_{I1}$ and $DATA_{I2}$ to the output 408 associated with the third logic output signal $DATA_{O3}$ is equivalent to a logic-OR operation of the logic input signals $DATA_{I1}$ and $DATA_{I2}$, demonstrated at 414.

Similarly, one of the superconducting cells 404, demonstrated as the superconducting cell 1_4, in a fourth column corresponding to a fourth of the outputs 408 associated with the logic output signal $DATA_{O4}$ is coupled to the respective input 406 corresponding to the logic input signal $DATA_{I1}$. Therefore, in response to an input pulse, such as indicative of a logic-high binary state, provided via the logic input signal $DATA_{I1}$, the logic output signal $DATA_{O4}$ is provided in a logic-high binary state (e.g., as an increased voltage on the respective output 408 resulting in an SFQ pulse via the sense amplifiers 16). Accordingly, the coupling of the respective input 406 corresponding to the logic input signal $DATA_{I1}$ to the output 408 associated with the fourth logic output signal $DATA_{O4}$ is equivalent to a buffer operation of the logic input signal $DATA_{I1}$, demonstrated at 416.

Figure 10:
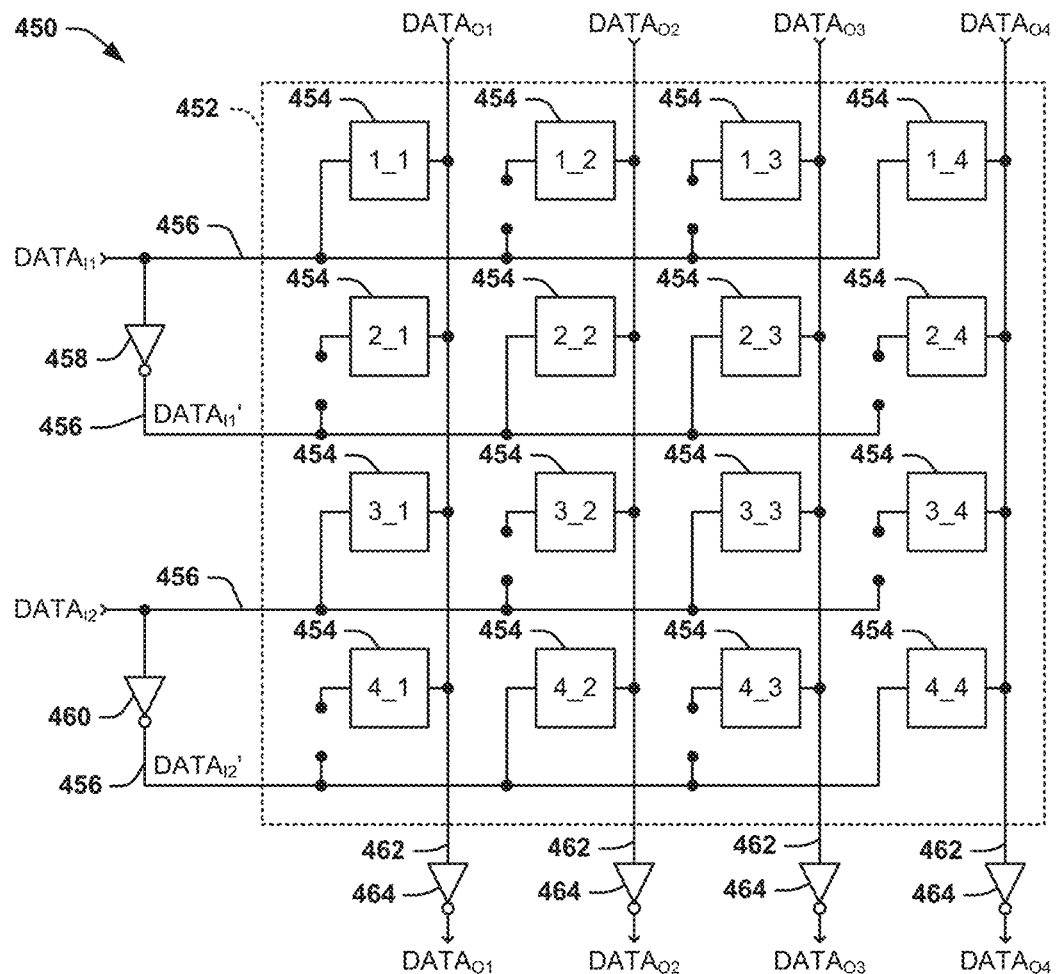
FIG. 10 illustrates an example diagram of a superconducting cell array logic circuit system.
Figure 10:
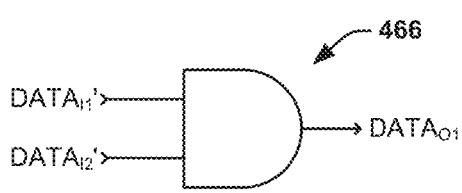
Figure 10:
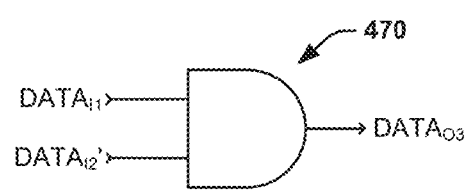
Figure 10:
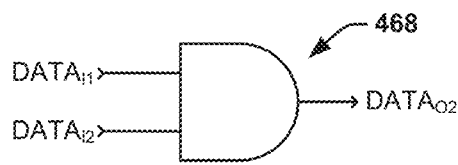
Figure 10:
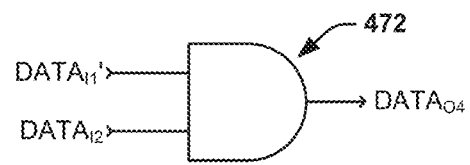

FIG. 10 illustrates an example diagram 450 of a superconducting cell array logic circuit system 452. The superconducting cell array logic circuit system 452 can correspond to the superconducting cell array 12 in the example of FIG. 1. Therefore, reference is to be made to the example of FIG. 1 in the following description of the example of FIG. 10.

The superconducting cell array logic circuit system 452 includes sixteen superconducting cells 454 that are arranged in an array of four rows and four columns, with the superconducting cells 454 being labeled in a "ROW_COLUMN" designation corresponding to a relative position in the superconducting cell array logic circuit system 452. In the example of FIG. 10, the superconducting cell array logic circuit system 452 is provided four logic input signals, demonstrated as signals $DATA_{I1}$, $DATA_{I1}'$, $DATA_{I2}$, and $DATA_{I2}'$, on separate respective inputs 456. In the example of FIG. 10, the logic input signals $DATA_{I1}'$ and $DATA_{I2}'$ are generated as inverted versions of the logic input signals $DATA_{I1}$ and $DATA_{I2}$ based on respective inverters 458 and 460. Similarly, the superconducting cell array logic circuit system 452 is demonstrated as generating four logic output signals, demonstrated as signals $DATA_{O1}$ through $DATA_{O4}$, on separate respective outputs 462. Therefore, each of the inputs 456 is associated with each of the superconducting cells 454 in a respective row of the superconducting cell array logic circuit system 452, and each of the outputs 462 is associated with each of the superconducting cells 454 in a respective column of the superconducting cell array logic circuit system 452.

In the example of FIG. 10, each of the inputs 456 is demonstrated as being selectively coupled to a set of four of the superconducting cells 454 corresponding to a respective one of the four rows. As an example, the selective coupling can be based on selective inductive coupling at manufacture of the superconducting cell array logic circuit system 452, such as demonstrated in the examples of FIGS. 4 and 5. As another example, the selective coupling can be based on programming signals (not shown in the example of FIG. 10) that are provided to set the magnetic state of an HMJJD associated with each of the superconducting cells 454, such as demonstrated in the examples of FIGS. 6-8. As yet another example, the selective coupling can be based on a combination of inductive coupling and the magnetic state of an HMJJD associated with one or more of the superconducting cells 454.

In the example of FIG. 10, two of the superconducting cells 454 in each of the columns are coupled with the respective inputs 456. Additionally, each of the outputs 462 is provided to an inverter 464, such that the logic output signals $DATA_{O1}$ through $DATA_{O4}$ correspond to the opposite logic state as that provided on the respective outputs 462.

As an example, the first and third superconducting cells 454, demonstrated as superconducting cell 1_1 and superconducting cell 3_1, associated with the logic output signal $DATA_{O1}$ are coupled to the respective inputs 456 corresponding to the logic input signals $DATA_{I1}$ and $DATA_{I2}$. Conversely, the second and fourth superconducting cells 454, demonstrated as superconducting cell 2_1 and superconducting cell 4_1, associated with the logic output signal $DATA_{O1}$ are not coupled to the respective inputs 456 corresponding to the logic input signals $DATA_{I1}'$ and $DATA_{I2}'$. Therefore, in response to an input pulse, such as indicative of a logic-high binary state, provided via the logic input signals $DATA_{I1}$ and $DATA_{I2}$, and thus in response to input pulses, such as indicative of a logic-high binary state, at each of the logic input signals $DATA_{I1}'$ and $DATA_{I2}'$, the logic output signal $DATA_{O1}$ is provided in a logic-high binary state (e.g., as an increased voltage on the respective output 462 resulting in an SFQ pulse via the sense amplifiers 16). Accordingly, the coupling of the respective inputs 456 corresponding to the logic input signals $DATA_{I1}$ and $DATA_{I2}$ to the output 462 associated with the first logic output signal $DATA_{O1}$ is equivalent to a logic-AND operation of the logic input signals $DATA_{I1}'$ and $DATA_{I2}'$, demonstrated at 466.

As another example, the second and fourth superconducting cells 454, demonstrated as superconducting cell 2_2 and superconducting cell 4_2, associated with the logic output signal $DATA_{O2}$ are coupled to the respective inputs 456 corresponding to the logic input signals $DATA_{I1}'$ and $DATA_{I2}'$. Conversely, the first and third superconducting cells 454, demonstrated as superconducting cell 1_2 and superconducting cell 3_2, associated with the logic output signal $DATA_{O2}$ are not coupled to the respective inputs 456 corresponding to the logic input signals $DATA_{I1}$ and $DATA_{I2}$. Therefore, in response to input pulses provided via the logic input signals $DATA_{I1}$ and $DATA_{I2}$, the logic output signal $DATA_{O2}$ is provided in a logic-high binary state. Accordingly, the coupling of the respective inputs 456 corresponding to the logic input signals $DATA_{I1}'$ and $DATA_{I2}'$ to the output 462 associated with the second logic output signal $DATA_{O2}$ is equivalent to a logic-AND operation of the logic input signals $DATA_{I1}$ and $DATA_{I2}$, demonstrated at 468.

As another example, the second and third superconducting cells 454, demonstrated as superconducting cell 2_3 and superconducting cell 3_3, associated with the logic output signal $DATA_{O3}$ are coupled to the respective inputs 456 corresponding to the logic input signals $DATA_{I1}'$ and $DATA_{I2}$. Conversely, the first and fourth superconducting cells 454, demonstrated as superconducting cell 1_3 and superconducting cell 4_3, associated with the logic output signal $DATA_{O3}$ are not coupled to the respective inputs 456 corresponding to the logic input signals $DATA_{I1}$ and $DATA_{I2}'$. Therefore, in response to input pulses provided via the logic input signals $DATA_{I1}$ and $DATA_{I2}'$, the logic output signal $DATA_{O3}$ is provided in a logic-high binary state. Accordingly, the coupling of the respective inputs 456 corresponding to the logic input signals $DATA_{I1}'$ and $DATA_{I2}$ to the output 462 associated with the third logic output signal $DATA_{O3}$ is equivalent to a logic-AND operation of the logic input signals $DATA_{I1}'$ and $DATA_{I2}$, demonstrated at 470.

As an example, the first and fourth superconducting cells 454, demonstrated as superconducting cell 1_4 and superconducting cell 4_4, associated with the logic output signal $DATA_{O4}$ are coupled to the respective inputs 456 corresponding to the logic input signals $DATA_{I1}$ and $DATA_{I2}'$. Conversely, the second and third superconducting cells 454, demonstrated as superconducting cell 2_4 and superconducting cell 3_4, associated with the logic output signal $DATA_{O4}$ are not coupled to the respective inputs 456 corresponding to the logic input signals $DATA_{I1}'$ and $DATA_{I2}$. Therefore, in response to input pulses provided via the logic input signals $DATA_{I1}'$ and $DATA_{I2}$, the logic output signal $DATA_{O4}$ is provided in a logic-high binary state (e.g., as an increased voltage on the respective output 462 resulting in a SFQ pulse via the sense amplifiers 16). Accordingly, the coupling of the respective inputs 456 corresponding to the logic input signals $DATA_{I1}'$ and $DATA_{I2}$ to the output 462 associated with the fourth logic output signal $DATA_{O4}$ is equivalent to a logic-AND operation of the logic input signals $DATA_{I1}'$ and $DATA_{I2}$, demonstrated at 472.

Figure 11:
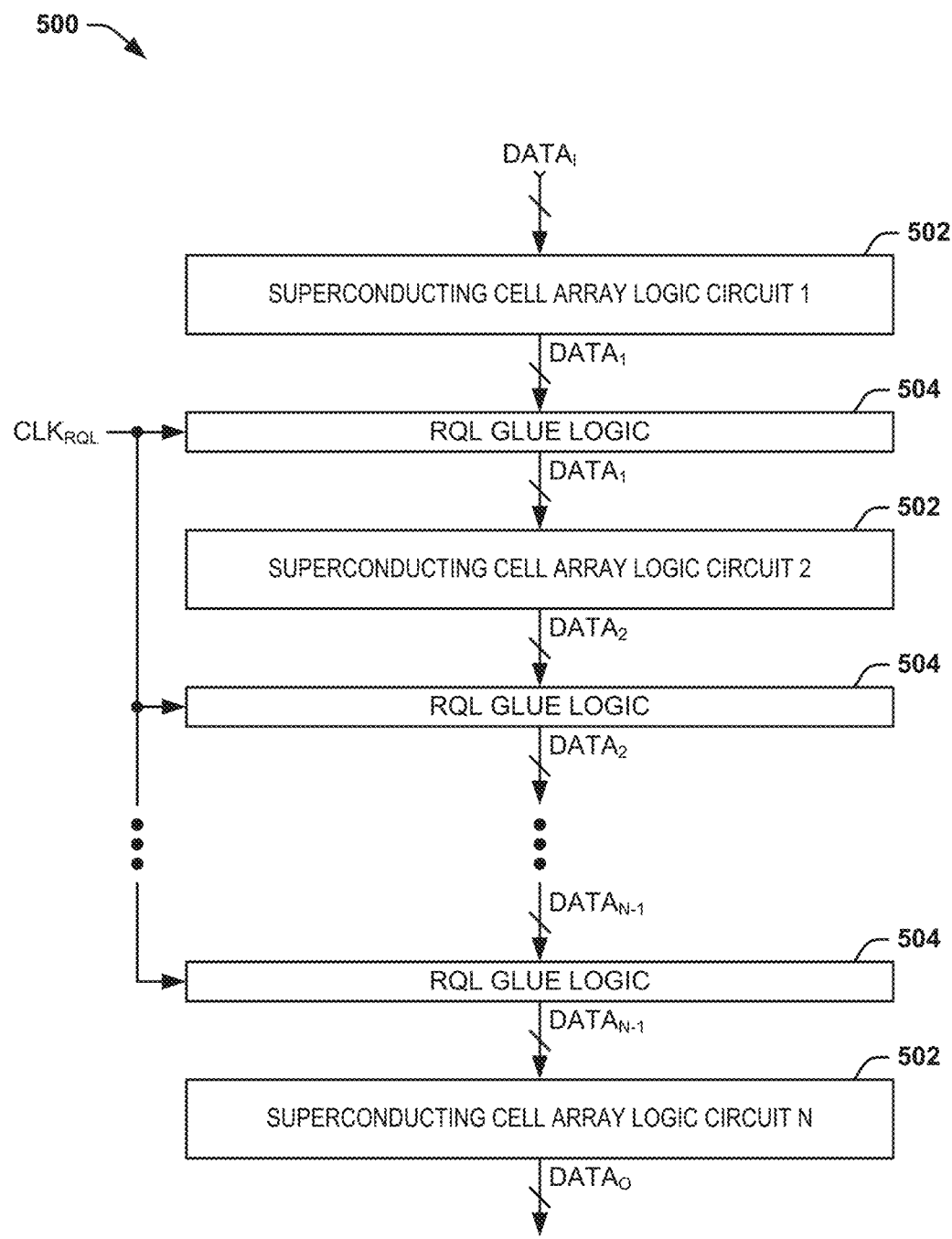
FIG. 11 illustrates an example diagram of a superconducting circuit.

FIG. 11 illustrates an example of a superconducting circuit 500. The superconducting circuit 500 can include a plurality N of superconducting cell array logic circuit systems 502, where N is a positive integer. Each of the superconducting cell array logic circuit systems 502 can be configured substantially similar to the superconducting cell array logic circuit system 10 in the example of FIG. 1, and can thus include an array of superconducting cells that are selectively coupled to a set of inputs to provide a predetermined logic operation at one or more outputs.

In the example of FIG. 11, one or more logic input signals $DATA_I$ are provided to a first superconducting cell array logic circuit system 502, demonstrated as SUPERCONDUCTING CELL ARRAY LOGIC CIRCUIT 1. The first superconducting cell array logic circuit system 502 can thus implement a predetermined logic operation on the logic input signal(s) $DATA_I$ to provide one or more logic output signals, demonstrated as logic output signal(s) $DATA_I$. The logic output signal(s) $DATA_I$ are then provided to a first of a plurality of RQL glue logic circuits 504. The RQL glue logic circuits 504 interconnect the superconducting cell array logic circuit systems 502, such that the output associated with one superconducting cell array logic circuit system 502 forms the input of a next sequential superconducting cell array logic circuit system 502 via a given one of the RQL glue logic circuits 504. The RQL glue logic circuits 504 can thus be configured to phase-align the logic output signal DATA from one of the superconducting cell array logic circuit systems 502 to a logic input signal DATA of the next sequential one of the superconducting cell array logic circuit systems 502 based on an RQL clock signal (e.g., a quadrature clock signal), demonstrated in the example of FIG. 11 as a signal $CLK_{RQL}$. Therefore, the first of the RQL glue logic circuits 504 is configured to phase-align the logic output signal $DATA_1$ output from the first of the superconducting cell array logic circuit systems 502 with the logic input signal $DATA_1$ that is provided to the second of the superconducting cell array logic circuit systems 502, demonstrated as SUPERCONDUCTING CELL ARRAY LOGIC CIRCUIT 2, based on the RQL clock signal $CLK_{RQL}$.

Therefore, each of the superconducting cell array logic circuit systems 502 can provide successive logic operations on the logic data signals DATA, with each of the RQL glue logic circuits 504 providing phase-alignment of the logic output signals DATA with the logic input signals DATA of the next superconducting cell array logic circuit system 504 in succession. In the example of FIG. 11, a last RQL glue logic circuit 504 provides phase-alignment of the logic output signal $DATA_{N-1}$ output from a penultimate of the superconducting cell array logic circuit systems 502 with the logic input signal $DATA_{N-1}$ that is provided to a last of the superconducting cell array logic circuit systems 502, demonstrated as SUPERCONDUCTING CELL ARRAY LOGIC CIRCUIT N, based on the RQL clock signal $CLK_{RQL}$. Accordingly, the last of the superconducting cell array logic circuit systems 502 is configured to provide a logic output signal $DATA_O$ that corresponds to an output of the superconducting circuit 500. Accordingly, multiple superconducting cell array logic circuit systems 502 can be implemented to provide more complex superconducting logic circuits.

Figure 12:
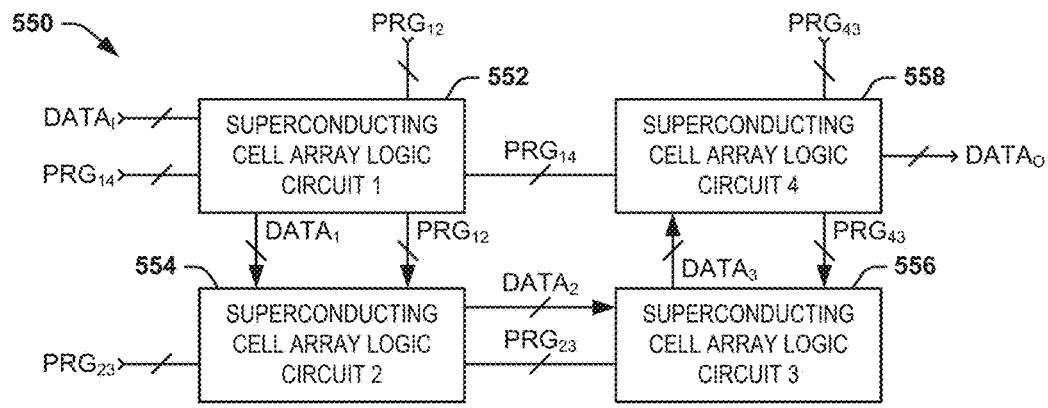
FIG. 12 illustrates another example diagram of a superconducting circuit.

FIG. 12 illustrates another example of a superconducting circuit 550. The superconducting circuit 550 includes four superconducting cell array logic circuit systems, demonstrated as a first superconducting cell array logic circuit system 552, a second superconducting cell array logic circuit system 554, a third superconducting cell array logic circuit system 556, and a fourth superconducting cell array logic circuit system 558. Each of the superconducting cell array logic circuit systems 552, 554, 556, and 558 can be configured substantially similar to the superconducting cell array logic circuit system 10 in the example of FIG. 1, and can thus include an array of superconducting cells that are selectively coupled to a set of inputs to provide a predetermined logic operation at one or more outputs. While the superconducting circuit 550 does not include RQL glue logic circuits, such as the RQL glue logic circuits 504 in the example of FIG. 11, it is to be understood that the superconducting circuit 550 can include an RQL glue logic circuit controlled by an RQL clock signal between each of the superconducting cell array logic circuit systems 552, 554, 556, and 558 in succession.

In the example of FIG. 12 each of the superconducting cell array logic circuit systems 552, 554, 556, and 558 can include an array of superconducting cells that are each configured substantially the same as the superconducting cell 250 in the examples of FIGS. 6-8. Therefore, each of the superconducting cells in each of the superconducting cell array logic circuit systems 552, 554, 556, and 558 can include an HMJJD that can be responsive to programming signals to set the magnetic state of the respective HMJJD to provide the selective coupling of the inputs of the respective superconducting cell array logic circuit systems 552, 554, 556, and 558 to the outputs of the superconducting cell array logic circuit systems 552, 554, 556, and 558. Accordingly, the superconducting circuit 550 can be field-programmable, similar to an FPGA, to provide a predetermined sequence of logic operations on logic input signal(s) DATA$_I$ to provide logic output signal(s) DATA$_O$.

In the example of FIG. 12, one or more logic input signals DATA$_I$ are provided to the first superconducting cell array logic circuit system 552, demonstrated as SUPERCONDUCTING CELL ARRAY LOGIC CIRCUIT 1. The first superconducting cell array logic circuit system 552 can thus implement a predetermined logic operation on the logic input signal(s) DATA$_I$ to provide one or more logic output signals, demonstrated as logic output signal(s) DATA$_1$. The predetermined logic operation can be based on the selective coupling of the input(s) to the output(s) based on a first set of programming signal(s) PRG14 and a second set of programming signal(s) PRG12. As an example, the first set of programming signal(s) PRG14 can be associated with the rows of the superconducting cells in the first superconducting cell array logic circuit system 552, and the second set of programming signal(s) PRG12 can be associated with the columns of the superconducting cells in the first superconducting cell array logic circuit system 552. For example, a given magnetic state of a respective HMJJD of a superconducting cell of the first superconducting cell array logic circuit system 552 can be set based on an orthogonal intersection of one of the programming signal(s) PRG14 and one of the programming signal(s) PRG12 that are concurrently provided. The first superconducting cell array logic circuit system 552 can thus provide the logic output signal(s) DATA$_1$ in response to the logic input signal(s) DATA$_I$ based on the predetermined logic operation.

The logic input signal(s) DATA$_1$ are provided to the second superconducting cell array logic circuit system 554, demonstrated as SUPERCONDUCTING CELL ARRAY LOGIC CIRCUIT 2. The second superconducting cell array logic circuit system 554 can thus implement a predetermined logic operation on the logic input signal(s) DATA$_1$ to provide one or more logic output signals, demonstrated as logic output signal(s) DATA$_2$. In the example of FIG. 12, the logic input signal(s) DATA$_1$ are provided as column input(s) based on being provided as column output(s) from the first superconducting cell array logic circuit system 552. Therefore, the second superconducting cell array logic circuit system 554 can be arranged such that the rows and columns can be reversed in two-dimensions relative to the first superconducting cell array logic circuit system 552. In addition, the predetermined logic operation can be based on the selective coupling of the input(s) to the output(s) based on a set of programming signal(s) PRG23 and the set of programming signal(s) PRG12. As an example, the set of programming signal(s) PRG23 can be associated with the rows of the superconducting cells in the second superconducting cell array logic circuit system 554, and the set of programming signal(s) PRG12 can be associated with the columns of the superconducting cells in the second superconducting cell array logic circuit system 554, similar to as provided to the first superconducting cell array logic circuit system 552. Therefore, the set of programming signal(s) PRG12 can be associated with both the first superconducting cell array logic circuit system 552 and the second superconducting cell array logic circuit system 554. For example, a given magnetic state of a respective HMJJD of a superconducting cell of the second superconducting cell array logic circuit system 554 can be set based on an orthogonal intersection of one of the programming signal(s) PRG23 and one of the programming signal(s) PRG12 that are concurrently provided. The second superconducting cell array logic circuit system 554 can thus provide the logic output signal(s) DATA$_2$ in response to the logic input signal(s) DATA$_1$ based on the predetermined logic operation.

The logic input signal(s) DATA$_2$ are provided to the third superconducting cell array logic circuit system 556, demonstrated as SUPERCONDUCTING CELL ARRAY LOGIC CIRCUIT 3. The third superconducting cell array logic circuit system 556 can thus implement a predetermined logic operation on the logic input signal(s) DATA$_2$ to provide one or more logic output signals, demonstrated as logic output signal(s) DATA$_3$. In the example of FIG. 12, the logic input signal(s) DATA$_2$ are provided as row input(s) based on being provided as row output(s) from the second superconducting cell array logic circuit system 554. Therefore, the third superconducting cell array logic circuit system 556 can be arranged such that the rows and columns can be reversed in two-dimensions relative to the second superconducting cell array logic circuit system 554. In addition, the predetermined logic operation can be based on the selective coupling of the input(s) to the output(s) based on a set of programming signal(s) PRG43 and the set of programming signal(s) PRG23. As an example, the set of programming signal(s) PRG23 can be associated with the rows of the superconducting cells in the third superconducting cell array logic circuit system 556, and the set of programming signal(s) PRG43 can be associated with the columns of the superconducting cells in the third superconducting cell array logic circuit system 556, similar to as provided to the second superconducting cell array logic circuit system 554. Therefore, the set of programming signal(s) PRG23 can be associated with both the second superconducting cell array logic circuit system 554 and the third superconducting cell array logic circuit system 556. For example, a given magnetic state of a respective HMJJD of a superconducting cell of the third superconducting cell array logic circuit system 556 can be set based on an orthogonal intersection of one of the programming signal(s) PRG23 and one of the programming signal(s) PRG43 that are concurrently provided. The third superconducting cell array logic circuit system 556 can thus provide the logic output signal(s) DATA$_3$ in response to the logic input signal(s) DATA$_2$ based on the predetermined logic operation.

The logic input signal(s) DATA$_3$ are provided to the fourth superconducting cell array logic circuit system 558, demonstrated as SUPERCONDUCTING CELL ARRAY LOGIC CIRCUIT 4. The fourth superconducting cell array logic circuit system 558 can thus implement a predetermined logic operation on the logic input signal(s) DATA$_3$ to provide one or more logic output signals, demonstrated as logic output signal(s) DATA$_O$ corresponding to an output of the superconducting circuit 550. In the example of FIG. 12, the logic input signal(s) DATA$_3$ are provided as column input(s) based on being provided as column output(s) from the third superconducting cell array logic circuit system 556. Therefore, the fourth superconducting cell array logic circuit system 558 can be arranged such that the rows and columns can be reversed in two-dimensions relative to the third superconducting cell array logic circuit system 556. In addition, the predetermined logic operation can be based on the selective coupling of the input(s) to the output(s) based on a set of programming signal(s) PRG43 and the set of programming signal(s) PRG14. As an example, the set of programming signal(s) PRG14 can be associated with the rows of the superconducting cells in the fourth superconducting cell array logic circuit system 558, and the set of programming signal(s) PRG43 can be associated with the columns of the superconducting cells in the fourth superconducting cell array logic circuit system 558, similar to as provided to the third superconducting cell array logic circuit system 556. Therefore, the set of programming signal(s) PRG43 can be associated with both the third superconducting cell array logic circuit system 556 and the fourth superconducting cell array logic circuit system 558, and the set of programming signal(s) PRG14 can be associated with both the first superconducting cell array logic circuit system 552 and the fourth superconducting cell array logic circuit system 558. For example, a given magnetic state of a respective HMJJD of a superconducting cell of the fourth superconducting cell array logic circuit system 558 can be set based on an orthogonal intersection of one of the programming signal(s) PRG14 and one of the programming signal(s) PRG43 that are concurrently provided. The fourth superconducting cell array logic circuit system 558 can thus provide the logic output signal(s) DATA$_O$ in response to the logic input signal(s) DATA$_3$ based on the predetermined logic operation.

Figure 13:
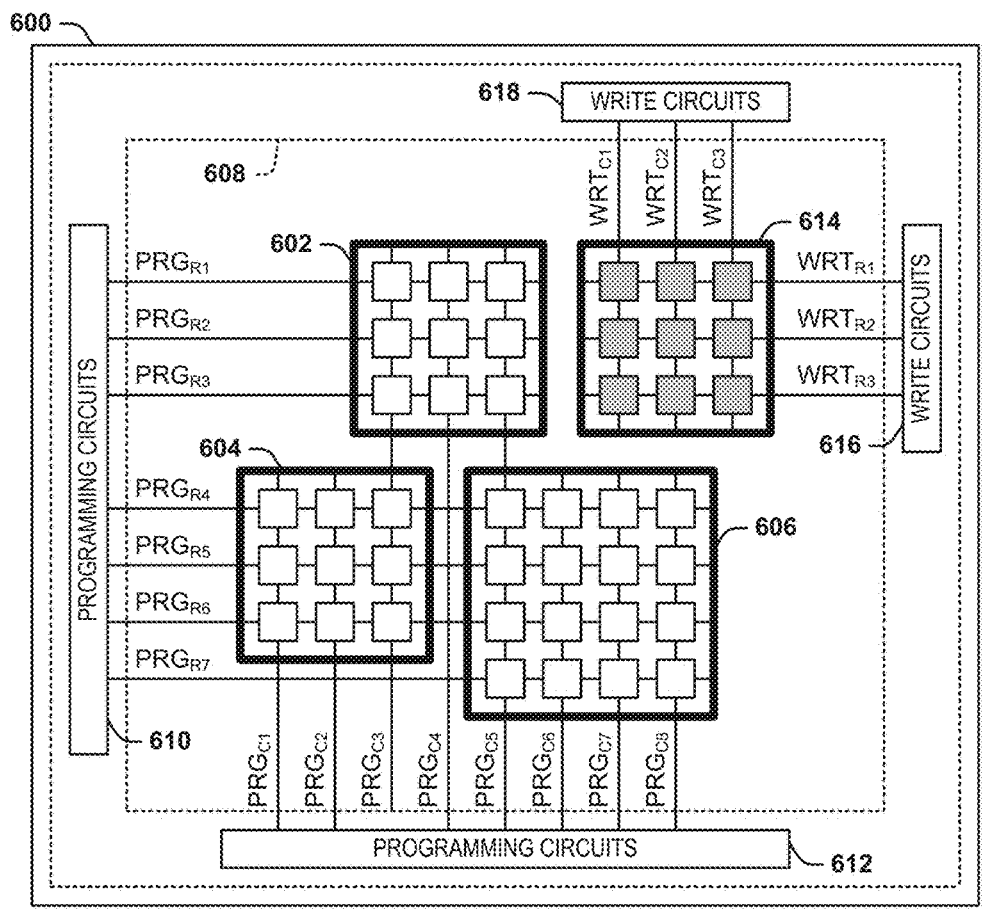
FIG. 13 illustrates an example of a superconducting circuit system.

FIG. 13 illustrates an example of a superconducting circuit system 600. As an example, the superconducting circuit system 600 can be implemented on an integrated circuit (IC) chip. The superconducting circuit system 600 includes three superconducting cell array logic circuit systems, demonstrated as a first superconducting cell array logic circuit system 602, a second superconducting cell array logic circuit system 604, and a third superconducting cell array logic circuit system 606. Each of the superconducting cell array logic circuit systems 602, 604, and 606 can be configured substantially similar to the superconducting cell array logic circuit system 10 in the example of FIG. 1, and can thus include an array of superconducting cells that are selectively coupled to a set of inputs to provide a predetermined logic operation at one or more outputs.

In the example of FIG. 13, the first and second superconducting cell array logic circuit systems 602 and 604 include an array of nine superconducting cells, while the third superconducting cell array logic circuit system 606 includes an array of sixteen superconducting cells. While the superconducting cell array logic circuit systems 602, 604, and 606 are demonstrated as including nine and sixteen superconducting cells, respectively, it is to be understood that the superconducting cell array logic circuit systems 602, 604, and 606 can each include a different number of superconducting cells, and that the arrays of superconducting cells do not have to be equal with respect to rows and columns. Additionally, while the superconducting circuit 600 does not include RQL glue logic circuits, such as the RQL glue logic circuits 504 in the example of FIG. 10, it is to be understood that the superconducting circuit 600 can include an RQL glue logic circuit controlled by an RQL clock signal between each of the interconnections of the superconducting cell array logic circuit systems 602, 604, and 606 in succession.

Each of the superconducting cell array logic circuit systems 602, 604, and 606 can include an array of superconducting cells that are each configured substantially the same as the superconducting cell 250 in the examples of FIGS. 6-8. Therefore, each of the superconducting cells in each of the superconducting cell array logic circuit systems 602, 604, and 606 can include an HMJJD that can be responsive to programming signals to set the magnetic state of the respective HMJJD to provide the selective coupling of the inputs of the respective superconducting cell array logic circuit systems 602, 604, and 606 (not shown in the example of FIG. 13) to the outputs of the superconducting cell array logic circuit systems 602, 604, and 606 (not shown in the example of FIG. 13). Accordingly, the superconducting circuit 600 can be field-programmable, similar to an FPGA, to provide a predetermined sequence of logic operations on logic input signal(s) to provide logic output signal(s) (not shown in the example of FIG. 13, respectively).

In the example of FIG. 13, the superconducting circuit system 600 includes peripheral circuitry 608. The peripheral circuitry 608 includes programming circuits 610 and 612 that are configured to generate programming signals. Each of the superconducting cell array logic circuit systems 602, 604, and 606 receives a plurality of programming signals associated with rows and columns of the respective superconducting cell array logic circuit systems 602, 604, and 606, generated by the programming circuits 610 and 612, respectively. The programming circuit 610 generates row programming signals PRG$_{R1}$ through PRG$_{R7}$, and the programming circuit 612 generates column programming signals PRG$_{C1}$ through PRG$_{C8}$.

In the example of FIG. 13, the row programming signals PRG$_{R1}$ through PRG$_{R3}$ are associated only with the rows of the first superconducting cell array logic circuit system 602, respectively. However, the row programming signals PRG$_{R4}$ through PRG$_{R6}$ are associated with the all of the rows of the second superconducting cell array logic circuit system 604 and a subset of the rows of the third superconducting cell array logic circuit system 606. The row programming signal PRG$_{R7}$ is associated with a last row of the third superconducting cell array logic circuit system 606. Similarly, the column programming signals PRG$_{C1}$ and PRG$_{C2}$ are associated only with the first two columns of the second superconducting cell array logic circuit system 604, respectively. However, the column programming signal $PRG_{C3}$ is associated with a column of each of the second superconducting cell array logic circuit system 604 and the first superconducting cell array logic circuit system 602. The column programming signal $PRG_{C4}$ is associated with one column of only the first superconducting cell array logic circuit system 602. The column programming signal $PRG_{C5}$ is associated with a column of each of the third superconducting cell array logic circuit system 606 and the first superconducting cell array logic circuit system 602, and the column programming signals $PRG_{C6}$ through $PRG_{C8}$ are associated only with the last three columns of the third superconducting cell array logic circuit system 606, respectively. Therefore, similar to the superconducting circuit system 550 in the example of FIG. 12, the row and column programming signals $PRG_R$ and $PRG_C$ can be applied to superconducting cells in more than one of the superconducting cell array logic circuit systems of the superconducting circuit system 600 in the example of FIG. 13.

In addition, the superconducting circuit system 600 includes a memory array 614 that includes an array of nine memory cells arranged in columns and columns. As an example, the memory array 614 can include an array of memory cells that are each configured substantially the same as the superconducting cell 250 in the examples of FIGS. 6-8. Therefore, each of the memory cells in each of the memory array 614 can include an HMJJD is configured to store a magnetic state that can correspond to a stored binary logic state, similar to as described in U.S. patent application Ser. No. 14/043,360, that is incorporated herein by reference in its entirety. The magnetic state corresponding to the stored digital logic state can be stored in response to write signals, demonstrated as row write signals $WRT_{R1}$ through $WRT_{R3}$, generated by a write circuit 616, and column write signals $WRT_{C1}$ through $WRT_{C3}$, generated by a write circuit 618. Accordingly, the superconducting cell array described herein can be implemented as both a means of programming a logic state of a superconducting cell array logic circuit system and as a means of storing data, and can be implemented on a common circuit (e.g., in a common chip). The programming signals PRG and the write signals WRT can thus be implemented separately for separate control of the superconducting cell array logic circuit systems relative to the memory array(s).

Figure 14:
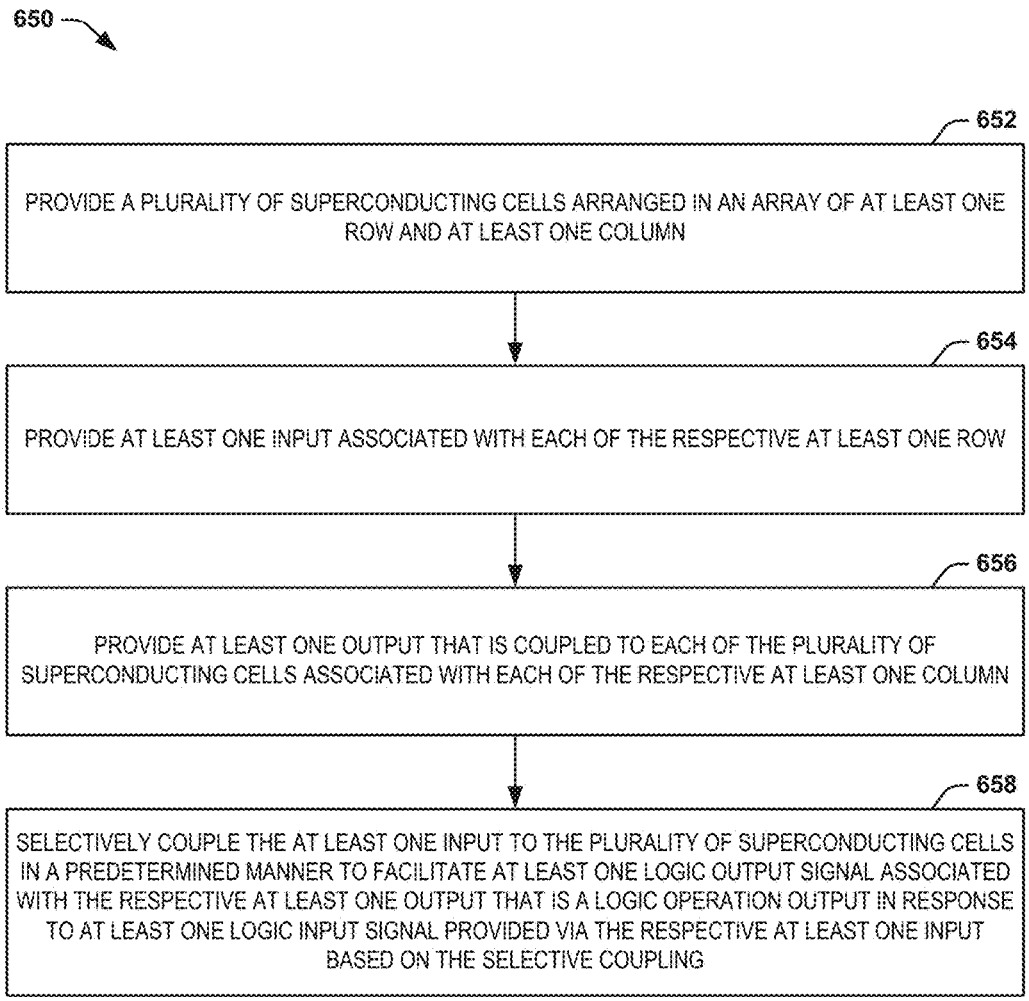
FIG. 14 illustrates an example of a method for generating a superconducting cell array logic circuit system.

In view of the foregoing structural and functional features described above, a methodology in accordance with various aspects of the present invention will be better appreciated with reference to FIG. 14. While, for purposes of simplicity of explanation, the methodology of FIG. 14 is shown and described as executing serially, it is to be understood and appreciated that the present invention is not limited by the illustrated order, as some aspects could, in accordance with the present invention, occur in different orders and/or concurrently with other aspects from that shown and described herein. Moreover, not all illustrated features may be required to implement a methodology in accordance with an aspect of the present invention.

FIG. 9 illustrates an example of a method 650 for generating a superconducting cell array logic circuit system (e.g., the superconducting cell array logic circuit system 10). At 652, a plurality of superconducting cells (e.g., the superconducting cells 52 or the superconducting cells 250) arranged in an array (e.g., the superconducting array 50) of at least one row and at least one column is provided. At 654, at least one input (e.g., the inputs 56) associated with each of the respective at least one row is provided. At 656, at least one output (e.g., the outputs 58) that is coupled to each of the plurality of superconducting cells associated with each of the respective at least one column is provided. At 658, the at least one input to the plurality of superconducting cells is selectively coupled in a predetermined manner (e.g., based on the examples of FIGS. 4 and 5 or based on the examples of FIGS. 6-8) to facilitate at least one logic output signal (e.g., the logic output signal(s) $DATA_O$) associated with the respective at least one output that is a logic operation output in response to at least one logic input signal (e.g., the logic input signal(s) $DATA_I$) provided via the respective at least one input based on the selective coupling.

What have been described above are examples of the invention. It is, of course, not possible to describe every conceivable combination of components or methodologies for purposes of describing the invention, but one of ordinary skill in the art will recognize that many further combinations and permutations of the invention are possible. Accordingly, the invention is intended to embrace all such alterations, modifications, and variations that fall within the scope of this application, including the appended claims. Additionally, where the disclosure or claims recite "a," "an," "a first," or "another" element, or the equivalent thereof, it should be interpreted to include one or more than one such element, neither requiring nor excluding two or more such elements. As used herein, the term "includes" means includes but not limited to, and the term "including" means including but not limited to. The term "based on" means based at least in part on.

What is claimed is:

1. A superconducting cell array logic circuit system comprising a plurality of superconducting cells arranged in an array of at least one row and at least one column, the superconducting cell array logic circuit system being configured to implement a logic operation on at least one logic input signal received at at least one respective input associated with the respective at least one row to provide at least one logic output signal on at least one respective output associated with the at least one column based on a predetermined selective coupling of the at least one input to the at least one output via the plurality of superconducting cells.

2. The system of claim 1, wherein each of the plurality of superconducting cells comprises a superconducting quantum interference device (SQUID) comprising at least one Josephson junction that is coupled to a respective one of the at least one output, such that the at least one Josephson junction is configured to trigger to provide the logic output signal in response to the logic input signal based on the respective one of the at least one input being coupled to the respective one of the at least one output.

3. The system of claim 2, wherein each of the plurality of superconducting cells further comprises either an inductive coupling between the respective one of the at least one input and the SQUID to provide coupling between the respective one of the at least one input and the respective one of the at least one output, or comprises no inductive coupling between the respective one of the at least one input and the SQUID to provide non-coupling between the respective one of the at least one input and the respective one of the at least one output.

4. The system of claim 2, wherein each of the plurality of superconducting cells further comprises a hysteretic magnetic Josephson junction device (HMJJD) configured to store one of a first magnetic state and a second magnetic state in response to at least one programming signal, wherein the HMJJD provides coupling between the respective one of the at least one input and the respective one of the at least one output in the first magnetic state and provides non-coupling between the respective one of the at least one input and the respective one of the at least one output in the second magnetic state.

5. The system of claim 1, wherein the superconducting cell array logic circuit system comprises a plurality of programming inputs configured to receive a respective plurality of programming signals to set the predetermined selective coupling of the at least one input to the at least one output via the plurality of superconducting cells.

6. The system of claim 5, wherein each of the plurality of superconducting cells comprises a hysteretic magnetic Josephson junction device (HMJJD) configured to store one of a first magnetic state and a second magnetic state in response to at least one of the plurality of programming signals, wherein the HMJJD provides coupling between the respective one of the at least one input and the respective one of the at least one output in the first magnetic state and provides non-coupling between the respective one of the at least one input and the respective one of the at least one output in the second magnetic state.

7. A superconducting circuit comprising the superconducting cell array logic circuit system of claim 1 arranged as a first superconducting cell array logic circuit system configured to implement a first logic operation to provide at least one first logic output signal, the superconducting circuit further comprising an additional superconducting cell array logic circuit system, the additional superconducting cell array logic circuit system comprising a plurality of superconducting cells arranged in an array of at least one row and at least one column, the superconducting cell array logic circuit system being configured to implement a second logic operation on at least one second logic input signal received via at least one second input that is coupled to the at least one output associated with the first superconducting cell array logic circuit system to provide at least one second logic output signal on at least one respective output based on a predetermined selective coupling of the at least one input to the at least one output via the plurality of superconducting cells.

8. The superconducting circuit of claim 7, further comprising reciprocal quantum logic (RQL) glue logic that interconnects the at least one output associated with the first superconducting cell array logic circuit system and the at least one input associated with the second superconducting cell array logic circuit system, the RQL glue logic being responsive to an RQL clock signal to phase-align the at least one first logic output signal and the at least one second logic input signal.

9. A superconducting circuit comprising a plurality of superconducting cell array logic circuit systems comprising the superconducting cell array logic circuit system of claim 1, each of the plurality of superconducting cell array logic circuit systems comprising at least one input, at least one output, and a plurality of superconducting cells, and being configured to implement a logic operation on at least one logic input signal based on a predetermined selective coupling of the respective at least one input to the respective at least one output via the respective plurality of superconducting cells based on a plurality of programming signals, wherein at least one of the plurality of programming signals is provided to more than one of the plurality of the superconducting cell array logic circuit systems to facilitate the predetermined selective coupling in the respective more than one of the plurality of superconducting cell array logic circuit systems.

10. The superconducting circuit of claim 9, further comprising at least one superconducting memory array comprising:
at least one memory input coupled to at least one of the plurality of superconducting cell array logic circuit systems;
at least one memory output coupled to at least one of the plurality of superconducting cell array logic circuit systems; and
a plurality of superconducting cells comprising a respective plurality of hysteretic magnetic Josephson junction devices (HMJJD) that are each configured to store a binary logic state in response to a bit-write and a word-write current, and to provide an indication of the respective binary logic state via the at least one memory output in response to a read-current provided via the at least one memory input.

11. A method for generating a superconducting cell array logic circuit system, the method comprising:
providing a plurality of superconducting cells arranged in an array of at least one row and at least one column;
providing at least one input associated with each of the respective at least one row;
providing at least one output that is coupled to each of the plurality of superconducting cells associated with each of the respective at least one column; and
selectively coupling the at least one input to the plurality of superconducting cells in a predetermined manner to facilitate at least one logic output signal associated with the respective at least one output that is a logic operation output in response to at least one logic input signal provided via the respective at least one input based on the selective coupling.

12. The method of claim 11, wherein providing the plurality of superconducting cells comprises providing each of the plurality of superconducting cells to comprise a superconducting quantum interference device (SQUID) comprising at least one Josephson junction that is coupled to a respective one of the at least one output, such that the at least one Josephson junction is configured to trigger to provide the at least one logic output signal in response to the at least one logic input signal based on the respective one of the at least one input being coupled to the respective one of the at least one output.

13. The method of claim 11, wherein selective coupling comprises selectively coupling the at least one input to the plurality of superconducting cells.

14. The method of claim 11, wherein selectively coupling comprises:
providing an inductive coupling of a respective one of the at least one input to a respective one of the at least one output to provide coupling of the respective at least one input to a respective one of the plurality of superconducting cells; and
providing no inductive coupling of the respective one of the at least one input to the respective one of the at least one output to provide non-coupling of the respective at least one input to a respective one of the plurality of superconducting cells.

15. The method of claim 11, wherein providing the plurality of superconducting cells comprises providing each of the plurality of superconducting cells to comprise a hysteretic magnetic Josephson junction device (HMJJD) configured to store one of a first magnetic state and a second magnetic state, wherein selectively coupling comprises providing at least one programming signal to set the HMJJD associated with each of the plurality of superconducting cells to store the first magnetic state to provide coupling of the respective at least one input to a respective one of the plurality of superconducting cells or the second magnetic state to provide non-coupling of the respective at least one input to a respective one of the plurality of superconducting cells.

16. The method of claim 11, wherein providing the plurality of superconducting cells comprises providing a first plurality of superconducting cells arranged in a first array, wherein providing at least one input comprises providing at least one first input, wherein providing at least one output comprises providing at least one first output, and wherein selectively coupling comprises selectively coupling the at least one first input to the first plurality of superconducting cells in a predetermined manner to facilitate at least one first logic output signal associated with the respective at least one first output that is a first logic operation output in response to at least one first logic input signal provided via the respective at least one first input based on the selective coupling, the method further comprising:
 providing a second plurality of superconducting cells arranged in a second array of at least one row and at least one column;
 providing at least one second input associated with each of the respective at least one row of the second array, the at least one second input corresponding to the at least one first output;
 providing at least one second output that is coupled to each of the second plurality of superconducting cells associated with each of the respective at least one column of the second array; and
 selectively coupling the at least one second input to the second plurality of superconducting cells in a predetermined manner to facilitate at least one second logic output signal associated with the respective at least one second output that is a second logic operation output in response to at least one second logic input signal provided via the respective at least one second input based on the selective coupling.

17. A superconducting circuit system comprising:
 a first superconducting cell array logic circuit system comprising a first plurality of superconducting cells arranged in a first array of at least one row and at least one column, the first superconducting cell array logic circuit system being configured to implement a first logic operation on at least one logic input signal received at a respective at least one first input associated with the respective at least one row of the first array to provide at least one first logic output signal on a respective at least one first output associated with the at least one column of the first array based on a predetermined selective coupling of the at least one first input to the at least one first output via the plurality of superconducting cells; and a second superconducting cell array logic circuit system comprising a second plurality of superconducting cells arranged in a second array of at least one row and at least one column, the second superconducting cell array logic circuit system being configured to implement a second logic operation on at least one second logic input signal received at a respective at least one second input associated with the respective at least one row of the second array and being coupled to the at least one first output to provide at least one second logic output signal on a respective at least one second output associated with the at least one column of the second array based on a predetermined selective coupling of the at least one second input to the at least one second output via the second plurality of superconducting cells.

18. The system of claim 17, further comprising reciprocal quantum logic (RQL) glue logic that interconnects the at least one first output and the at least one second input, the RQL glue logic being responsive to an RQL clock signal to phase-align the at least one first logic output signal and the at least one second logic input signal.

19. The system of claim 17, further comprising a plurality of programming inputs configured to receive a respective plurality of programming signals, wherein the plurality of programming signals are configured to set the predetermined selective coupling of the at least one first and second inputs to the at least one first and second outputs via the respective first and second plurality of superconducting cells in each of the first and second superconducting cell array logic circuit systems, wherein at least one of the plurality of programming inputs is associated with both the first plurality of superconducting cells and the second plurality of superconducting cells.

20. The system of claim 17, further comprising at least one superconducting memory array comprising:
 at least one memory input coupled to at least one of the first and second input or at least one of the first and second output associated with the respective first and second superconducting cell array logic circuit systems;
 at least one memory output coupled to at least one of the plurality of superconducting cell array logic circuit systems; and
 a plurality of superconducting cells comprising a respective plurality of hysteretic magnetic Josephson junction devices (HMJJD) that are each configured to store a binary logic state in response to a bit-write and a word-write current, and to provide an indication of the respective binary logic state via the at least one memory output in response to a read-current provided via the at least one memory input.

* * * * *